(12) United States Patent
Knappenberger et al.

(10) Patent No.: US 11,454,677 B2
(45) Date of Patent: Sep. 27, 2022

(54) WIRELESS CONTROL AND STATUS MONITORING FOR ELECTRIC GRILL WITH CURRENT PROTECTION CIRCUITRY

(71) Applicant: Weber-Stephen Products LLC, Palatine, IL (US)

(72) Inventors: Eric Knappenberger, Chicago, IL (US); Julio C. Zuleta, Gilberts, IL (US); Matthew Lerch, Chicago, IL (US); Jeffery C. Emmerich, Delavan, WI (US)

(73) Assignee: Weber-Stephen Products LLC, Palatine, IL (US)

( * ) Notice: Subject to any disclaimer, the term of this patent is extended or adjusted under 35 U.S.C. 154(b) by 267 days.

(21) Appl. No.: 15/493,611

(22) Filed: May 5, 2017

(65) Prior Publication Data

US 2018/0007739 A1    Jan. 4, 2018

Related U.S. Application Data

(63) Continuation-in-part of application No. 15/200,687, filed on Jul. 1, 2016, now Pat. No. 10,524,312.

(51) Int. Cl.
*H05B 3/68* (2006.01)
*G01R 31/52* (2020.01)
(Continued)

(52) U.S. Cl.
CPC .......... *G01R 31/52* (2020.01); *A47J 37/0709* (2013.01); *G01R 15/202* (2013.01);
(Continued)

(58) Field of Classification Search
CPC .... H02H 1/0007; H02H 3/105; H02H 1/0061; H02H 3/04; H02H 3/08; H02H 3/167;
(Continued)

(56) References Cited

U.S. PATENT DOCUMENTS 3,775,591 A    11/1973   Gould, Jr.
4,219,857 A *  8/1980   Haraldsson .............. H02H 5/04
                                                           219/509
(Continued)

FOREIGN PATENT DOCUMENTS

CN           1508479        6/2004
CN           2847774       12/2006
(Continued)

OTHER PUBLICATIONS

Official Action dated Jul. 31, 2018 in corresponding Japanese Patent Application No. 2017-128811.
(Continued)

*Primary Examiner* — Sang Y Paik
(74) *Attorney, Agent, or Firm* — Hanley, Flight & Zimmerman, LLC

(57) ABSTRACT

Provided is an apparatus and method for protecting against unsafe electric current conditions. A protections circuit may be used in a device, such as an electric grill, that has one or more electric loads, such as heating elements. The protection circuit may protect against various failure scenarios, including, without limitation, instances of ground fault, over current, driver failure, and failure of a microprocessor. The microprocessor may further be in wireless communication with a remote device and wirelessly communicate error codes indicative of an error, and receive control signals from the remote device for controlling temperature or turning the grill off. The remote device may also receive operating parameters and create a log of the electric grill's conditions at the time of an error.

26 Claims, 13 Drawing Sheets

(51) Int. Cl.
  *H05B 1/02* (2006.01)
  *A47J 37/07* (2006.01)
  *G01R 15/20* (2006.01)
  *H02H 3/10* (2006.01)
  *H02H 1/00* (2006.01)
  *G01R 19/165* (2006.01)

(52) U.S. Cl.
  CPC ......... *G01R 19/165* (2013.01); *H02H 1/0007* (2013.01); *H02H 1/0061* (2013.01); *H02H 3/105* (2013.01); *H05B 1/0261* (2013.01); *H05B 1/0266* (2013.01)

(58) Field of Classification Search
  CPC .......... H02H 3/32; H05B 1/0266; H05B 1/02; A47J 37/07; A47J 37/0709; G01R 15/202; G01R 19/165; G01R 31/025; G05D 23/00
  USPC ............................ 219/443.1–468.2, 475–519
  See application file for complete search history.

(56) References Cited

U.S. PATENT DOCUMENTS

| | | |
|---|---|---|
| 4,634,843 A | 1/1987 | Payne |
| 4,780,787 A | 10/1988 | Dano |
| 5,171,973 A | 12/1992 | Higgins |
| 5,280,422 A | 1/1994 | Moe et al. |
| 5,302,857 A | 4/1994 | Charles et al. |
| 5,413,032 A | 5/1995 | Bruno et al. |
| 5,524,528 A | 6/1996 | Yeh |
| 5,578,230 A | 11/1996 | Eldon |
| 5,606,245 A | 2/1997 | Kirby |
| 5,710,408 A | 1/1998 | Jones |
| 5,719,377 A | 2/1998 | Giebel et al. |
| 5,908,571 A | 6/1999 | Scott |
| 5,982,593 A | 11/1999 | Kimblin et al. |
| 5,986,242 A | 11/1999 | Maitani |
| 5,994,671 A | 11/1999 | Suzuki et al. |
| 6,037,571 A | 3/2000 | Christopher |
| 6,057,997 A | 5/2000 | Mackenzie et al. |
| 6,111,230 A | 8/2000 | Cao |
| 6,118,106 A | 9/2000 | Scott |
| 6,697,244 B1 | 2/2004 | Bauer et al. |
| 6,727,475 B2 | 4/2004 | Kennard |
| 6,849,833 B2 | 2/2005 | Harrington |
| 6,927,368 B2 | 8/2005 | Cao |
| 7,131,549 B2 | 11/2006 | Hook |
| 7,312,426 B2 | 12/2007 | Han |
| 7,342,202 B2 | 3/2008 | Bachinski |
| 7,368,686 B2 | 5/2008 | Etheredge |
| 7,675,007 B2 | 3/2010 | Ashton |
| 7,825,353 B2 | 11/2010 | Shingler |
| 8,030,598 B2 | 10/2011 | Bachinski |
| 8,097,835 B2 | 1/2012 | Hsieh |
| 8,102,080 B2 | 1/2012 | Fonseca et al. |
| 8,141,478 B2 | 3/2012 | Kuo |
| 8,263,911 B2 | 9/2012 | Yen |
| 8,624,169 B1 | 1/2014 | Sorenson et al. |
| 8,680,440 B2 | 3/2014 | Cohen |
| 8,927,908 B2 | 1/2015 | Wang |
| 9,978,553 B2 | 5/2018 | Tomimbang |
| 10,524,312 B2 | 12/2019 | Knappenberger et al. |
| 10,537,199 B2 | 1/2020 | Knappenberger et al. |
| 10,551,893 B2 | 2/2020 | Knappenberger et al. |
| 2001/0033743 A1 | 10/2001 | Kishita |
| 2003/0218846 A1 | 11/2003 | Telamo |
| 2006/0043087 A1 | 3/2006 | Gagas et al. |
| 2006/0050464 A1 | 3/2006 | Von Arx et al. |
| 2007/0116485 A1 | 5/2007 | Nishida |
| 2007/0145034 A1* | 6/2007 | Imura ................... F24C 7/082 219/494 |
| 2007/0208520 A1 | 9/2007 | Zhang |
| 2007/0262074 A1 | 11/2007 | Shearer |
| 2008/0031302 A1* | 2/2008 | Rund ...................... G01K 7/42 374/102 |
| 2008/0036581 A1 | 2/2008 | Bunims |
| 2008/0136581 A1 | 6/2008 | Heilman et al. |
| 2009/0154033 A1 | 6/2009 | Tomimbang |
| 2009/0167085 A1 | 7/2009 | Fonseca et al. |
| 2010/0296217 A1 | 11/2010 | Darmann |
| 2011/0132900 A1 | 6/2011 | Kinoshita et al. |
| 2011/0160931 A1 | 6/2011 | Hsieh |
| 2011/0284518 A1* | 11/2011 | Elston, III ............. F24C 7/087 219/391 |
| 2013/0271886 A1* | 10/2013 | Cull ........................ H02H 3/08 361/87 |
| 2013/0334212 A1 | 12/2013 | Sawada et al. |
| 2014/0005834 A1 | 1/2014 | Hoffman |
| 2014/0242227 A1 | 8/2014 | Yang et al. |
| 2015/0312964 A1* | 10/2015 | Sorenson ............. A47J 37/0611 219/448.13 |
| 2015/0346264 A1* | 12/2015 | Curtis .................. G01R 31/025 324/509 |
| 2016/0003484 A1 | 1/2016 | Span et al. |
| 2016/0044745 A1 | 2/2016 | Nakayama |
| 2016/0193739 A1 | 7/2016 | Vermette |
| 2016/0196739 A1 | 7/2016 | Naber et al. |
| 2016/0231721 A1 | 8/2016 | Lakshmanan |
| 2017/0020324 A1 | 1/2017 | Young et al. |
| 2018/0000277 A1 | 1/2018 | Knappenberger et al. |
| 2018/0004271 A1 | 1/2018 | Knappenberger et al. |
| 2018/0007738 A1 | 1/2018 | Knappenberger et al. |
| 2018/0007739 A1 | 1/2018 | Knappenberger et al. |
| 2020/0084837 A1 | 3/2020 | Knappenberger et al. |
| 2020/0100615 A1 | 4/2020 | Knappenberger et al. |
| 2020/0201414 A1 | 6/2020 | Knappenberger et al. |

FOREIGN PATENT DOCUMENTS

| | | |
|---|---|---|
| CN | 101277558 | 10/2008 |
| CN | 101577191 A | 11/2009 |
| CN | 201434433 Y | 3/2010 |
| CN | 102193443 | 9/2011 |
| CN | 202817705 U | 3/2013 |
| CN | 103263224 | 8/2013 |
| CN | 203167321 | 8/2013 |
| CN | 103416104 | 11/2013 |
| CN | 103645730 | 3/2014 |
| CN | 103926970 | 7/2014 |
| CN | 203785271 | 8/2014 |
| CN | 104065699 A | 9/2014 |
| CN | 204595584 U | 8/2015 |
| CN | 106162976 | 11/2016 |
| CN | 106211395 | 12/2016 |
| DE | 19842470 A1 | 3/2000 |
| EP | 0230246 A2 | 7/1987 |
| EP | 0258091 A1 | 3/1988 |
| EP | 0615327 A2 | 9/1994 |
| EP | 0804049 | 10/1997 |
| EP | 0906000 A2 | 3/1999 |
| EP | 2214458 | 8/2010 |
| EP | 1854719 A3 | 3/2012 |
| GB | 2067857 | 7/1981 |
| GB | 2239138 A | 6/1991 |
| GB | 2252647 A | 8/1992 |
| GB | 2329769 A | 3/1999 |
| GB | 2339348 | 1/2000 |
| GB | 2508198 | 5/2014 |
| JP | S53-050152 | 5/1978 |
| JP | S54-149042 A | 11/1979 |
| JP | S56-140422 | 7/1981 |
| JP | S57-011618 | 1/1982 |
| JP | S60-129813 A | 7/1985 |
| JP | S61-029916 | 2/1986 |
| JP | S61128033 A | 6/1986 |
| JP | S62-010513 | 1/1987 |
| JP | S62-073584 | 5/1987 |
| JP | S62-178821 | 11/1987 |
| JP | S63-049634 | 4/1988 |
| JP | S63-107412 A | 5/1988 |
| JP | H02-246769 | 10/1990 |

(56) References Cited

FOREIGN PATENT DOCUMENTS

| | | |
|---|---|---|
| JP | H03-251618 | 11/1991 |
| JP | H3-251618 A | 11/1991 |
| JP | H04-073523 | 3/1992 |
| JP | H04-073523 | 6/1992 |
| JP | H04-249088 | 9/1992 |
| JP | H04-336608 | 11/1992 |
| JP | H06-141003 | 5/1994 |
| JP | H07-078668 | 3/1995 |
| JP | H7-123504 A | 5/1995 |
| JP | H09-060888 | 3/1997 |
| JP | H9-182278 A | 7/1997 |
| JP | H09-258599 | 10/1997 |
| JP | H10-010917 | 1/1998 |
| JP | H11-018281 | 1/1999 |
| JP | H11-185953 | 7/1999 |
| JP | 2001308572 | 11/2001 |
| JP | 2002095586 | 4/2002 |
| JP | 2003014241 | 1/2003 |
| JP | 2003086347 A | 3/2003 |
| JP | 2003151759 A | 5/2003 |
| JP | 2004164431 | 6/2004 |
| JP | 2004212601 | 7/2004 |
| JP | 2005034379 A | 2/2005 |
| JP | 2005085514 | 3/2005 |
| JP | 2005195640 | 7/2005 |
| JP | 2005221086 | 8/2005 |
| JP | 2006340469 | 12/2006 |
| JP | 2008512979 A | 4/2008 |
| JP | 2008175437 | 7/2008 |
| JP | 2008180472 | 8/2008 |
| JP | 2008183763 | 8/2008 |
| JP | 2008223320 | 9/2008 |
| JP | 2008300171 | 12/2008 |
| JP | 2009510667 | 3/2009 |
| JP | 2009296802 | 12/2009 |
| JP | 2010-515976 A | 5/2010 |
| JP | 2010181044 | 8/2010 |
| JP | 2011067311 | 4/2011 |
| JP | 2011096484 | 5/2011 |
| JP | 2012242779 | 12/2012 |
| JP | 2012252851 | 12/2012 |
| JP | 2013518556 | 5/2013 |
| JP | 2014114967 | 6/2014 |
| JP | 2014190626 | 10/2014 |
| JP | 2015047389 A | 3/2015 |
| JP | 2015172447 | 10/2015 |
| JP | 2015190643 | 11/2015 |
| JP | 2016151383 | 8/2016 |
| JP | 2018007549 | 1/2018 |
| WO | 2014079493 | 5/2014 |
| WO | 2014079735 | 5/2014 |
| WO | 20150115663 | 8/2015 |
| WO | 20150138985 | 9/2015 |
| WO | 2016105551 A1 | 6/2016 |

OTHER PUBLICATIONS

Extended European Search Report dated Sep. 12, 2018 in corresponding European Patent Application No. 18169824.2.
Official Action dated Mar. 19, 2019 in corresponding Japanese Application No. 2018-085656.
Partial European Search Report, dated Dec. 6, 2017, in corresponding European Application No. 17179223.7.
Kenyon City Grill Owners Manual Mar. 28, 2011.
Meco Corp. 9300 Series Electric Barbecue Grill Owner's & Operator's Manual May 1999.
Stok Operator's Manual Electric Gridiron Grill STE11500 Jan. 22, 2014.
Dimplex North America Ltd. Power Chef Electric Grill TBQ-120 Owner's Manual 2010.
Extended European Search Report, dated Mar. 27, 2018, in corresponding European Application No. 17179223.7.
Office Action dated Apr. 22, 2019 in corresponding Chinese Application No. 201810415364.4.
First Office Action and Search Report dated Oct. 9, 2018 in corresponding Chinese Application No. 201710521319.2.
Notice of acceptance for patent application, dated Nov. 29, 2018, in corresponding Australian Application No. 2017204387.
Third Office Action, dated Mar. 16, 2020, in corresponding Chinese Application No. 201810415364.4.
European Patent Office, "Extended European Search Report," issued in connection with European Application No. 17179224,5, dated Feb. 9, 2018, 9 pages.
Australian Patent Office, "Examination Report No. 1," issued in connection with Australian Application No. 2017204389, dated Feb. 27, 2018, 6 pages.
Chinese Patent Office, "First Office Action and Search Report," issued in connection with Chinese Application No. 201710521776.1, dated Jun. 5, 2018, 7 pages.
Japanese Patent Office, "First Office Action," issued in connection with Japanese Application No. 2017-128814, dated Jun. 5, 2018, 8 pages (English translation provided).
European Patent Office, "Extended European Search Report," issued in connection with European Application No. 18169911.7, dated Oct. 4, 2018, 10 pages.
Australian Patent Office, "Examination Report No. 1," issued in connection with Australian Application No. 2018202490, dated Oct. 2, 2018, 7 pages.
United States Patent and Trademark Office, "Non-Final Office Action," issued in connection with U.S. Appl. No. 15/200,759, dated Mar. 15, 2019, 18 pages.
Japanese Patent Office, "Office Action," issued in connection with Japanese Application No. 2018-085657, dated Jun. 25, 2019, 8 pages (English translation provided).
Japanese Patent Office, "Office Action," issued in connection with Japanese Application No. 2018-154680, dated Jun. 25, 2019, 6 pages (English translation provided).
United States Patent and Trademark Office, "Notice of Allowance," issued in connection with U.S. Appl. No. 15/200,759, dated Aug. 19, 2019, 8 pages.
Chinese Patent Office, "Office Action," issued in connection with Chinese Application No. 201810418245.4, dated Sep. 20, 2019, 20 pages (English translation provided).
United States Patent and Trademark Office, "Requirement for Restriction," issued in connection with U.S. Appl. No. 15/493,696, dated Feb. 13, 2019, 6 pages.
United States Patent and Trademark Office, "Non-Final Office Action," issued in connection with U.S. Appl. No. 15/493,696, dated May 7, 2019, 7 pages.
United States Patent and Trademark Office, "Notice of Allowance," issued in connection with U.S. Appl. No. 15/493,696, dated Sep. 24, 2019, 7 pages.
United States Patent and Trademark Office, "Supplemental Notice of Allowance," issued in connection with U.S. Appl. No. 15/493,696, dated Nov. 29, 2019, 2 pages.
United States Patent and Trademark Office, "Non-Final Office Action," issued in connection with U.S. Appl. No. 15/200,687, dated Oct. 12, 2018, 9 pages.
United States Patent and Trademark Office, "Final Office Action," issued in connection with U.S. Appl. No. 15/200,687, dated Mar. 29, 2019, 10 pages.
United States Patent and Trademark Office, "Notice of Allowance," issued in connection with U.S. Appl. No. 15/200,687, dated Aug. 19, 2019, 7 pages.
Australian Patent Office, "Examination Report No. 1," issued in connection with Australian Application No. 2019203341, dated Apr. 29, 2020, 5 pages.
Japanese Patent Office, "Notice of reason for Rejection," issued in connection with Japanese Application No. 2018-085657, dated May 12, 2020, 8 pages (English translation provided).
Chinese Patent Office, "Second Office Action," issued in connection with Chinese Application No. 201810418245.4, dated Jul. 2, 2020, 8 pages.
Australian Patent Office, "Examination Report No. 1," issued in connection with Australian Patent Application No. 2019201672, dated Jan. 14, 2020, 2 pages.

(56) References Cited

OTHER PUBLICATIONS

Australian Patent Office, "Notice of Acceptance," issued in connection with Australian Patent Application No. 2019201672, dated May 20, 2020, 3 pages.
Australian Patent Office, "Examination Report No. 1," issued in connection with Australian Patent Application No. 2020202616, dated Apr. 29, 2021, 6 pages.
Australian Patent Office, "Examination Report No. 2," issued in connection with Australian Patent Application No. 2020202616, dated Sep. 21, 2021, 3 pages.
Canadian Patent Office, "Examiner Requisition" issued in connection with Canadian Patent Application No. 2971815, dated Jul. 19, 2018, 4 pages.
Canadian Patent Office, "Examiner Requisition" issued in connection with Canadian Patent Application No. 2971815, dated Feb. 17, 2020, 3 pages.
Australian Patent Office, "Examination Report No. 1," issued in connection with Australian Patent Application No. 2018202492, dated Apr. 5, 2019, 3 pages.
Australian Patent Office, "Examination Report No. 2," issued in connection with Australian Patent Application No. 2018202492, dated Aug. 26, 2019, 2 pages.
Australian Patent Office, "Notice of Acceptance," issued in connection with Australian Patent Application No. 2018202492, dated Oct. 24, 2019, 3 pages.
Australian Patent Office, "Examination Report No. 1," issued in connection with Australian Patent Application No. 2020200829, dated Feb. 10, 2021, 7 pages.
Australian Patent Office, "Notice of Acceptance," issued in connection with Australian Patent Application No. 2020200829, dated Jun. 23, 2021, 3 pages.
Canadian Patent Office, "Office Action," issued in connection with Canadian Patent Application No. 3000527, dated Mar. 11, 2019, 3 pages.
Canadian Patent Office, "Office Action," issued in connection with Canadian Patent Application No. 3000527, dated Nov. 20, 2019, 4 pages.
Canadian Patent Office, "Office Action," issued in connection with Canadian Patent Application No. 3094309, dated Sep. 23, 2021, 4 pages.
Chinese Patent Office, "Second Office Action," issued in connection with Chinese Patent Application No. 201810415364.4, dated Sep. 20, 2019, 7 pages (English translation provided).
Chinese Patent Office, "Notification to Grant Patent Right for Invention," issued in connection with Chinese Patent Application No. 201810415364.4, dated Jul. 6, 2020, 3 pages (English translation provided).
European Patent Office, "Intention to Grant," issued in connection with European Patent Application No. 18169824.2, dated Apr. 29, 2021, 8 pages.
Japanese Patent Office, "Search Report," issued in connection with Japanese Patent Application No. 2018-085656, dated Mar. 14, 2019, 102 pages (English translation provided).
Japanese Patent Office, "Decision to Grant a Patent," issued in connection with Japanese Patent Application No. 2018-085656, dated Nov. 12, 2019, 5 pages (English translation provided).
Japanese Patent Office, "Search Report," issued in connection with Japanese Patent Application No. 2019-224437, dated Dec. 7, 2020, 72 pages (English translation provided).
Chinese Patent Office, "Second Office Action," issued in connection with Chinese Patent Application No. 201710521319.2, dated Jun. 28, 2019, 7 pages (English translation provided).
Chinese Patent Office, "Notification to Grant Patent Right for Invention," issued in connection with Chinese Patent Application No. 201710521319.2, dated Oct. 9, 2019, 3 pages (English translation provided).
Chinese Patent Office, "First Office Action," issued in connection with Chinese Patent Application No. 201911342769.0, dated May 27, 2021, 33 pages (English translation provided).
Japanese Patent Office, "Search Report," issued in connection with Japanese Patent Application No. 2017-128811, dated Jun. 11, 2018, 15 pages (English translation provided).
Japanese Patent Office, "Decision to Grant a Patent," issued in connection with Japanese Patent Application No. 2017-128811, dated Jul. 2, 2019, 5 pages (English translation provided).
Japanese Patent Office, "Search Report," issued in connection with Japanese Patent Application No. 2019-142088, dated Oct. 12, 2020, 18 pages (English translation provided).
Japanese Patent Office, "Office Action," issued in connection with Japanese Patent Application No. 2019-142088, dated Oct. 27, 2020, 11 pages (English translation provided).
Japanese Patent Office, "Office Action," issued in connection with Japanese Patent Application No. 2019-142088, dated Jun. 22, 2021, 4 pages (English translation provided).
Australian Patent Office, "Examination Report No. 2," issued in connection with Australian Patent Application No. 2017204389, dated Jun. 13, 2018, 3 pages.
Australian Patent Office, "Examination Report No. 3," issued in connection with Australian Patent Application No. 2017204389, dated Oct. 26, 2018, 4 pages.
Australian Patent Office, "Notice of Acceptance," issued in connection with Australian Patent Application No. 2017204389, dated Feb. 1, 2019, 3 pages.
Australian Patent Office, "Notice of Acceptance," issued in connection with Australian Patent Application No. 2019203341, dated Aug. 17, 2020, 3 pages.
Australian Patent Office, "Examination Report No. 1," issued in connection with Australian Patent Application No. 2020260545, dated Oct. 29, 2021, 5 pages.
Canadian Patent Office, "Office Action," issued in connection with Canadian Patent Application No. 2971814, dated Jun. 19, 2018, 3 pages.
Canadian Patent Office, "Office Action," issued in connection with Canadian Patent Application No. 2971814, dated Jun. 19, 2019, 3 pages.
Canadian Patent Office, "Office Action," issued in connection with Canadian Patent Application No. 2971814, dated Sep. 3, 2020, 11 pages.
Canadian Patent Office, "Notice of Allowance," issued in connection with Canadian Patent Application No. 2971814, dated Jul. 14, 2021, 7 pages.
Australian Patent Office, "Notice of Acceptance," issued in connection with Australian Application No. 2018202490, dated Feb. 21, 2019, 3 pages.
Australian Patent Office, "Examination Report No. 1," issued in connection with Australian Patent Application No. 2019203941, dated Jun. 18, 2020, 4 pages.
Australian Patent Office, "Notice of Acceptance," issued in connection with Australian Patent Application No. 2019203941, dated Oct. 31, 2020, 3 pages.
Australian Patent Office, "Examination Report No. 1," issued in connection with Australian Patent Application No. 2021200734, dated Oct. 29, 2021, 6 pages.
Canadian Patent Office, "Notice of Allowance," issued in connection with Canadian Patent Application No. 300542, dated May 10, 2021, 6 pages.
Chinese Patent Office, "First Office Action," issued in connection with Chinese Patent Application No. 201810418245.4, dated Sep. 20, 2019, 20 pages (English translation provided).
Chinese Patent Office, "Third Office Action," issued in connection with Chinese Patent Application No. 201810418245.4, dated Mar. 1, 2021, 26 pages (English translation provided).
Chinese Patent Office, "Fourth Office Action," issued in connection with Chinese Patent Application No. 201810418245.4, dated Jun. 30, 2021, 21 pages (English translation provided).
European Patent Office, "Examination Report," issued in connection with European Patent Application No. 18169911.7, dated Dec. 4, 2020, 5 pages.
Japanese Patent Office, "Search Report," issued in connection with Japanese Patent Application No. 2018-085657, dated Jun. 19, 2019, 32 pages (English translation provided).

(56) References Cited

OTHER PUBLICATIONS

Japanese Patent Office, "Decision to Grant a Patent," issued in connection with Japanese Patent Application No. 2018-085657, dated Jan. 12, 2021, 5 pages (English translation provided).
Chinese Patent Office, "Third Office Action," issued in connection with Chinese Patent Application No. 201710521776.1, dated Sep. 18, 2019, 8 pages (English translation provided).
Chinese Patent Office, "Notification to Grant Patent Right for Invention," issued in connection with Chinese Patent Application No. 201710521776.1, dated Mar. 4, 2020, 3 pages (English translation provided).
Chinese Patent Office, "First Office Action," issued in connection with Chinese Patent Application No. 202010379486.X, dated Jul. 5, 2021, 11 pages (English translation provided).
European Patent Office, "Examination Report," issued in connection with European Patent Application No. 17179224.5, dated Oct. 23, 2020, 4 pages.
Japanese Patent Office, "Search Report," issued in connection with Japanese Patent Application No. 2017-128814, dated May 23, 2018, 59 pages (English translation provided).
Japanese Patent Office, "Decision to Grant a Patent," issued in connection with Japanese Patent Application No. 2017-128814, dated Oct. 23, 2018, 5 pages (English translation provided).
Japanese Patent Office, "Search Report," issued in connection with Japanese Patent Application No. 2018-154680, dated Jun. 19, 2019, 30 pages (English translation provided).
Japanese Patent Office, "Decision to Grant a Patent," issued in connection with Japanese Patent Application No. 2018-154680, dated Oct. 15, 2019, 5 pages (English translation provided).
Japanese Patent Office, "Office Action," issued in connection with Japanese Patent Application No. 2019-206237, dated Oct. 6, 2020, 15 pages (English translation provided).
Japanese Patent Office, "Office Action," issued in connection with Japanese Patent Application No. 2019-206237, dated Jan. 19, 2021, 6 pages (English translation provided).
Japanese Patent Office, "Decision to Grant a Patent," issued in connection with Japanese Patent Application No. 2019-206237, dated Apr. 27, 2021, 5 pages (English translation provided).
United States Patent and Trademark Office, "Non-Final Office Action," issued in connection with U.S. Appl. No. 16/688,354, dated Aug. 11, 2021, 13 pages.
Japanese Patent Office, "Decision to Grant a Patent," issued in connection with Japanese Patent Application No. 2019-142088, dated Nov. 16, 2021, 4 pages.
Japanese Patent Office, "Notice of Reasons for Refusal," issued in connection with Japanese Patent Application No. 2019-224437, dated Nov. 30, 2021, 12 pages.
Australian Patent Office, "Notice of Acceptance for patent application," issued in connection with Australian Patent Application No. 2020202616, dated Dec. 1, 2021, 3 pages.
Chinese Patent Office, "Fifth Office Action," issued in connection with Chinese Patent Application No. 201810418245.4, dated Nov. 3, 2021, 7 pages.
United States Patent and Trademark Office, "Final Office Action," issued in connection with U.S. Appl. No. 16/688,354, dated Jan. 7, 2022, 13 pages.
Chinese Patent Office, "Second Office Action," issued in connection with Chinese Patent Application No. 202010379486.X, dated Jan. 11, 2022, 5 pages.
China National Intellectual Property Administration, "Notification to Grant Patent Right for Invention," issued in connection with Chinese Patent Application No. 2019113427690, dated Jan. 18, 2022, 4 pages.
European Patent Office, "Examination Report," issued in connection with European Patent Application No. 18169911.7, dated Feb. 1, 2022, 6 pages.
European Patent Office, "Examination Report," issued in connection with European Patent Application No. 17179223.7, dated Feb. 11, 2022, 5 pages.
European Patent Office, "Notice of Intention to Grant," issued in connection with European Patent Application No. 17179224.5, dated Feb. 28, 2022, 7 pages.
Chinese Patent Office, "Decision on the Re-examination," issued in connection with Chinese Patent Application No. 201810418245.4, dated Mar. 14, 2022,1 page.
Japanese Patent Office, "Decision to Grant a Patent," issued in connection with Japanese Patent Application No. 2019-224437, dated Mar. 7, 2022, 5 pages (English translation included).
IP Australia, "Notice of acceptance," issued in connection with Australian Patent Application No. 2020260545, dated Mar. 24, 2022, 3 pages.
IP Australia, "Notice of Acceptance," issued in connection with Australian Patent Application No. 2021200734, dated Mar. 29, 2022, 3 pages.
China National Intellectual Property Administration, "First Office Action," issued in connection with Chinese Patent Application No. 202010985725.6, dated Mar. 2, 2022, 19 pages (English translation included).
European Patent Office, "Extended European Search Report," issued in connection with European Patent Application No. 21191918.8, dated Jan. 7, 2022, 8 pages.
United States Patent and Trademark Office, "Restriction Requirement," issued in connection with U.S. Appl. No. 16/724,807, dated Mar. 9, 2022, 6 pages.
Canadian Intellectual Property Office, "Notice of Allowance," issued in connection with Canadian Patent Application No. 3094309, dated Apr. 28, 2022, 1 page.
China National Intellectual Property Administration, "Notification to Grant Patent Right for Invention," issued in connection with Chinese Patent Application No. 202010379486.x, dated May 11, 2022, 6 pages.
China National Intellectual Property Administration, "Notification to Grant Patent Right for Invention," issued in connection with Chinese Patent Application No. 201810418245.4, dated May 19, 2022, 6 pages.
United States Patent and Trademark Office, "Requirement for Restriction," issued in connection with U.S. Appl. No. 16/688,287, dated May 27, 2022, 5 pages.
United States Patent and Trademark Office, "Non-Final Office Action," issued in connection with U.S. Appl. No. 16/724,807, dated Jun. 24, 2022, 14 pages.
United States Patent and Trademark Office, "Non-Final Office Action," issued in connection with U.S. Appl. No. 16/688,354, dated Jul. 6, 2022, 9 pages.
IP Australia, "Examination Report No. 1," issued in connection with Australian Patent Application No. 2021212146, dated Jun. 10, 2022, 3 pages.
Japanese Patent Office, "Decision to Grant Patent," issued in connection with Japanese Patent Application No. 2021-019730, dated Jun. 20, 2022,4 pages (English translation included).

\* cited by examiner

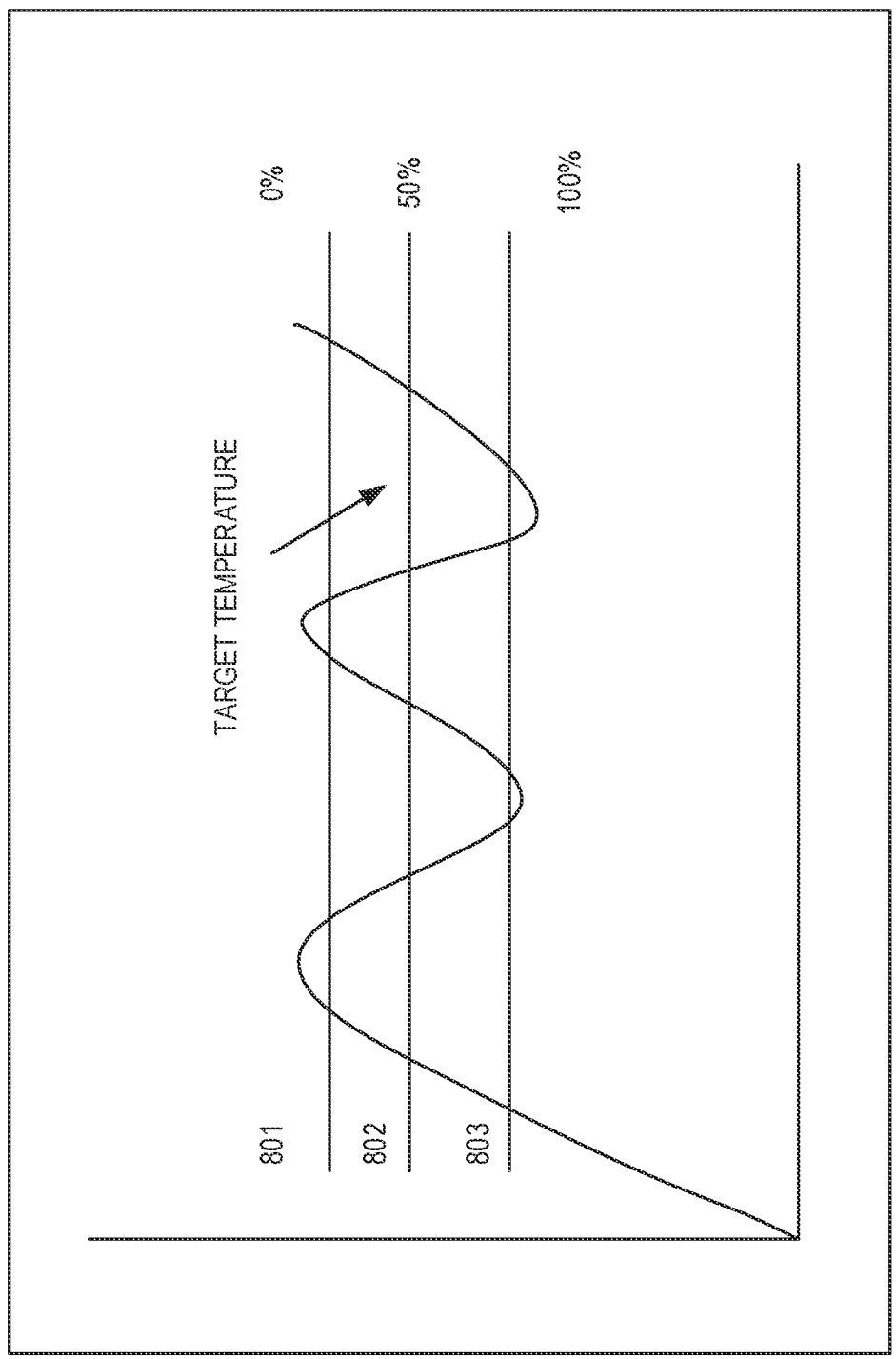

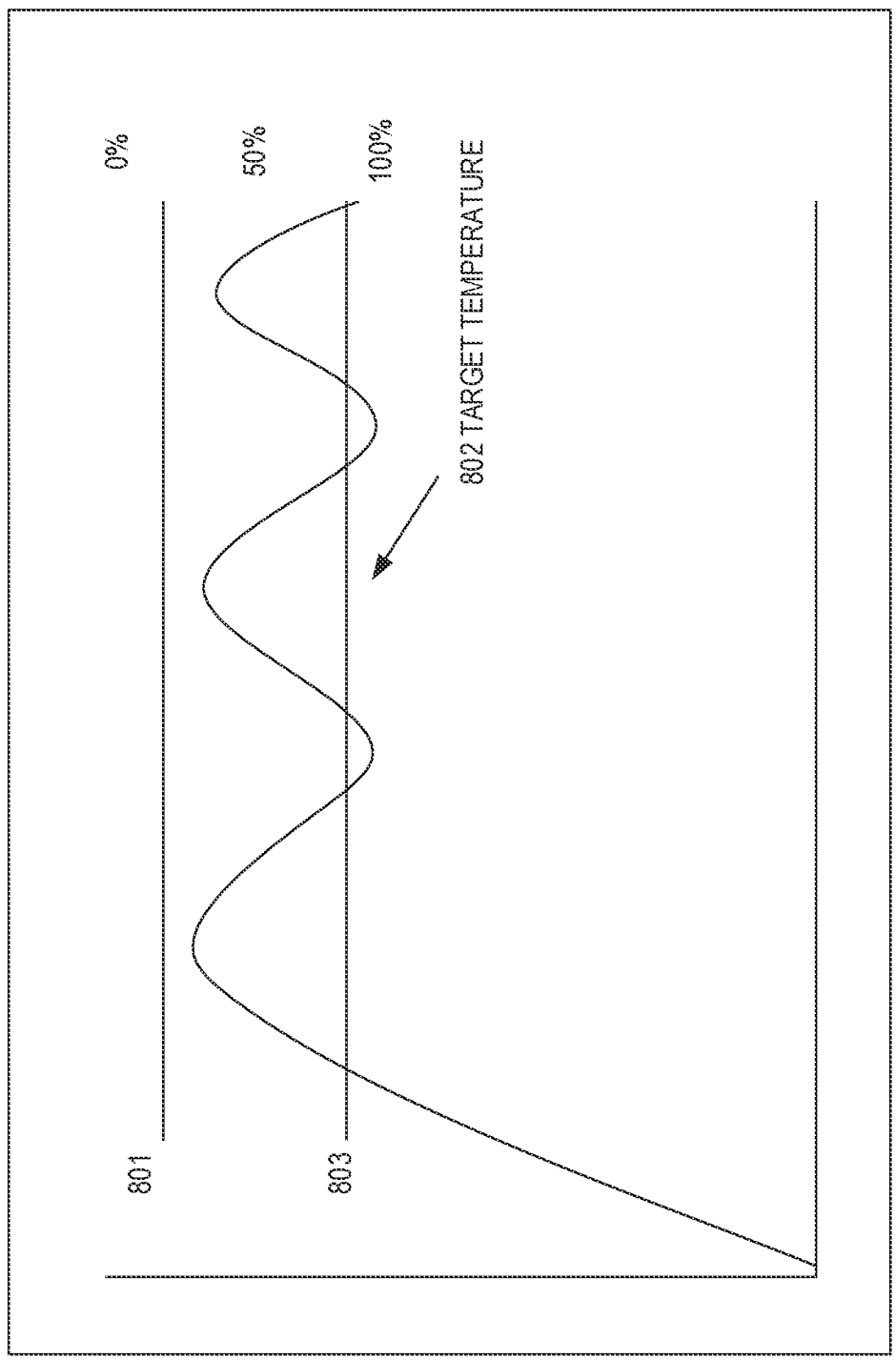

WIRELESS CONTROL AND STATUS MONITORING FOR ELECTRIC GRILL WITH CURRENT PROTECTION CIRCUITRY

RELATED APPLICATIONS

This application is a continuation-in-part of application Ser. No. 15/200,687, filed on Jul. 1, 2016, and incorporated herein in its entirety by reference.

FIELD OF THE INVENTION

The present inventions relate generally to electric grills and more particularly, to electric grills having advanced circuitry to protect against dangerous, faulty and unexpected current conditions. The electric grill may further includes a wireless controller for wirelessly communicating with a remote device in order to transfer operating parameters and to wirelessly control and monitor the grill.

BACKGROUND OF THE INVENTION

There is an increasing desire for electric grills. This is particularly true because the urban population is expanding. Many urban or other environments may not easily permit the use of traditional gas or charcoal grills. For example, many urban dwellers live in apartments or condominiums having balconies where they would like to use a grill. Because of smoke, gas or other concerns, use of typical charcoal or gas grills may not be permitted or desirable.

There are a number of available electric cooking devices, such as the George Foreman Plate Grill (and similar devices), panini presses, electric griddles and the like. However, these prior art electric cooking devices are typically intended for indoor use and are not designed or constructed for use in harsh or caustic environments where they may be degraded by high heat, weather conditions such as sun and rain, as well as fats from foods or acids from cleaning agents. These harsh conditions may cause the electrical components to degrade, which in turn may lead to electrical current leakage or other unsafe conditions.

Because prior art electric cooking devices are generally intended for indoor environments, a typical wall outlet's current protection scheme is generally sufficient for these devices. Such devices may also rely on a ground line for protection. Some prior art circuits include metal-oxide-semiconductor field-effect transistors (MOSFETs) to regulate current. Yet other prior art circuits are thermally-responsive. However, there is a need for advanced protection circuitry in an electric grill that can respond to the failure of components, including but not limited to those which cause improper current conditions, such as those that may be found in or caused by harsh environments.

For example, U.S. Pat. No. 8,263,911, entitled "Electronic Device with Heating Protection Circuit and Heating Protection Method Thereof," discloses an electronic device in which a control signal generated by a control module can assist the heating protection circuit in correctly determining whether a heating signal is failed or whether a control voltage of a control element is abnormal, and then automatically control the heating module to stop heating. The heating protection circuit uses a MOSFET coupled with a control module and a heating switch module. By contrast, some embodiments of the present invention use a combination of electro-mechanical and digital logic to detect multiple different types of failure conditions that simply cannot be detected by a MOSFET heating protection circuit.

Other prior art devices, referred to as thermally-responsive circuits, may shut down when a heating element reaches a threshold temperature. For example, U.S. Pat. No. 8,097,835, entitled "Temperature Control Circuit," discloses a temperature detecting module which detects the temperature of the electronic device for outputting a detection signal to a protection module and microprocessors. The protection module controls the status of the microprocessor. But such thermally responsive circuits are inadequate for harsh environments and current conditions which may lead to component failures. In fact, failed components may lead to current leakage, which does not always correlate with an overheated heating element. Dangerous current conditions may occur even if a heating element is within normal temperatures.

Thus, there is a need for an electric grill, including a grill with one or more independently controlled heating elements, having protection circuitry that protects against, among others things, short circuits, overcurrent, driver failure and/or microcontroller failure. Moreover, there is also a need for embodiments for an electric grill capable of communicating wirelessly with a remote device, such as a cell phone or tablet, to control the electric grill and convey operational information to a user. Such an electric grill can be monitored remotely by a user, where the user may be able to view operational information and control the grill remotely. For example, the electric grill may wirelessly convey operational parameters including include the cooking status of the electric grill, as well as an indication of whether the electric grill is operating normally (and if not, indicating which type of error has occurred).

BRIEF SUMMARY OF THE INVENTIONS

The present inventions overcome many of the deficiencies of known electric cooking devices and provide new features and advantages for electric grills. For example, the present inventions provide protection circuitry that shuts off power to the heating element or elements in the case of faulty, unexpected and/or dangerous current conditions. Moreover, embodiments of the present inventions provide an electric grill that is in wireless communication with a remote device and communicates various operational information, including the occurrence of dangerous current conditions, to a user.

The present inventions generally provide an electric grill with circuitry and a microprocessor configured to protect against unsafe electric current conditions. For example, embodiments of the inventions include a system for monitoring a status of an electric grill, the system having at least one heating element connectable to a voltage line and a neutral line; a Hall Effect sensor configured to measure current passing to said at least one heating element, a ground fault detection unit configured to detect a ground fault error between the voltage line and the neutral line; a wireless controller; and a microprocessor, the microprocessor being in communication with the Hall Effect sensor, the ground fault detection unit, and the wireless controller; wherein the microprocessor is adapted and configured to wirelessly send and receive signals to and from a remote device via the wireless controller.

Moreover, the microprocessor may be adapted and configured to identify an overcurrent error by comparing a current reading from the Hall Effect sensor to a predetermined current threshold, and to wirelessly send an error code to the remote device in response to an overcurrent error. The microprocessor may be adapted and configured to identify a current error by comparing a current reading from the Hall Effect sensor to an expected current, and to wirelessly send an error code to the remote device in response to a current error. Further yet, the microprocessor may be adapted and configured to receive a signal indicative of a ground fault error from the ground fault detection unit, and is further adapted and configured to wirelessly send an error code to the remote device in response to a ground fault error.

In some embodiments, the microprocessor is connected to a relay or a triac driver for controlling the current delivered to the at least one heating element. In additional features, the microprocessor may be adapted and configured to wirelessly receive an "off" signal from the remote device and, in response, to disable current from being delivered to the at least one heating element. Further yet, embodiments may include a cook box and at least one temperature sensing device for measuring a temperature inside the cook box, wherein the temperature sensing device is in electronic communication with the microprocessor. The inventions may further comprise a display in electronic communication with the microprocessor, wherein the microprocessor is adapted and configured to display the temperature on the display. The microprocessor may be further adapted and configured to toggle between displaying the temperature in Celsius or Fahrenheit in response to a wireless signal from the remote device.

Furthermore, the microprocessor may be adapted and configured to wirelessly transmit the temperature inside the cook box to the remote device. Moreover, the microprocessor may be adapted and configured to record operating parameters of the electric grill and to wirelessly transmit the operating parameters to the remote device. The microprocessor's transmission of operating parameters may be adapted and configured to be continuous, or the microprocessor's transmission of operating parameters can be adapted and configured to be in response to an error. The operating parameters may comprise a temperature measurement. Further, the operating parameters may comprise a timer indicative of the amount of time the heating element has been active. The microprocessor may be a chip having a self-check pin, and the wireless controller may be adapter and configured to wirelessly send an erode code to the remote device in response to a self-check signal indicating a microprocessor error.

Additional embodiments provide a system for wirelessly monitoring an electric grill's status, comprising an electric grill having protection circuitry, the protection circuitry comprising a microprocessor in electronic communication with a ground fault detection unit and a Hall Effect sensor; and a wireless controller in electronic communication with the microprocessor; wherein the microprocessor is configured to receive electronic signals from the ground fault detection unit and the Hall Effect sensor; and wherein the microprocessor is further adapted and configured to determine the occurrence of an error and, in response, wirelessly communicate an error code. Further, a remote device may be adapted and configured for wireless communication with the wireless controller, wherein the remote device is adapted and configured to wirelessly receive an error code. Moreover, the remote device can be adapted and configured to display, on a display, a message indicative of the type of error corresponding to the received error code. The remote device may be a cell phone, tablet and/or a computer.

Also provided is a method for wirelessly monitoring an electric grill's status, comprising the steps of: using a microprocessor in communication with a ground fault detection unit and a Hall Effect sensor to detect an error in the electric grill's operation; transmitting, wirelessly, an error code indicative of the error to a remote device. The method may additionally include the steps of: using the microprocessor to communicate with a temperature sensing device to measure the electric grill's temperature; using the microprocessor to determine the electric grill's active time; and transmitting, wirelessly, the electric grill's temperature and active time to the remote device.

In additional embodiments, the method includes using the remote device to display, at the remote device, a message indicative of the error received; and using the remote device to create and store a log in a memory, wherein the log comprises an error code, the electric grill's temperature, and the electric grill's active time. The remote device may communicate the log over the internet. Disclosed methods further include the step of using the remote device to communicate the log over the internet; the step of displaying, on a display at the electric grill, the electric grill's temperature; and the step of using the remote device to wirelessly toggle the display between Celsius and Fahrenheit.

An object of the present inventions is to provide a protection circuit that allows an electric grill to remain in an outdoor environment for prolonged periods of time without creating dangerous electric conditions and/or which protects the components of the grill.

An additional object of the present inventions is to provide an electric grill that can safely be used in outdoor or harsh environments.

A further object of the present inventions is to provide a protection circuit that detects current leakage and responds by disabling the flow of current.

A further object of the present inventions is to provide a protection circuit that detects a ground fault and responds by disabling the flow of current.

A further object of the present inventions is to provide a protection circuit that detects an unbalanced current and responds by disabling the flow of current.

Still another object of the present inventions is to provide a protection circuit that detects an overcurrent and responds by disabling the flow of current.

Still an additional object of the present inventions is to provide a protection circuit that detects a current draw that differs from an expected current draw and responds by disabling the flow of current.

Still yet a further object of the present inventions is to provide a protection circuit that includes a microprocessor and can detect when the microprocessor enters an abnormal state of operation.

And yet another object of the present inventions is to disable current flowing through an electric grill when an unsafe operating condition or failure scenario is detected.

Further objects of the invention include wirelessly communicating an error code indicative or an error to a remote device. Moreover, objects of the invention include displaying an electric grill's operating parameters at a remote device, and controlling the electric grill from the remote device.

And still yet another object of the present inventions is to provide a protection circuit that may be used on an electric grill or other devices, for indoor and/or outdoor use, to protect against unwanted, unsafe and/or unexpected current conditions.

Inventors' Definition of Terms

The terms used in the claims of this patent are intended to have their broadest meaning consistent with the requirements of law. Where alternative meanings are possible, the broadest meaning is intended. All words used in the claims are intended to be used in the normal, customary usage of grammar and the English language.

BRIEF DESCRIPTION OF THE DRAWINGS

The stated and unstated features, objects and advantages of the present invention (sometimes used in the singular, but not excluding the plural) will become apparent from the following description and drawings, wherein the like reference numerals represent like elements in the various views and in which:

FIG. 8A is a graph showing exemplary temperature fluctuations of an electric grill operating in a medium temperature range.

FIG. 8C is a graph showing exemplary temperature fluctuations of an electric grill operating at a high temperature range.

DETAILED DESCRIPTION OF THE PREFERRED EMBODIMENTS

Figure 1A:
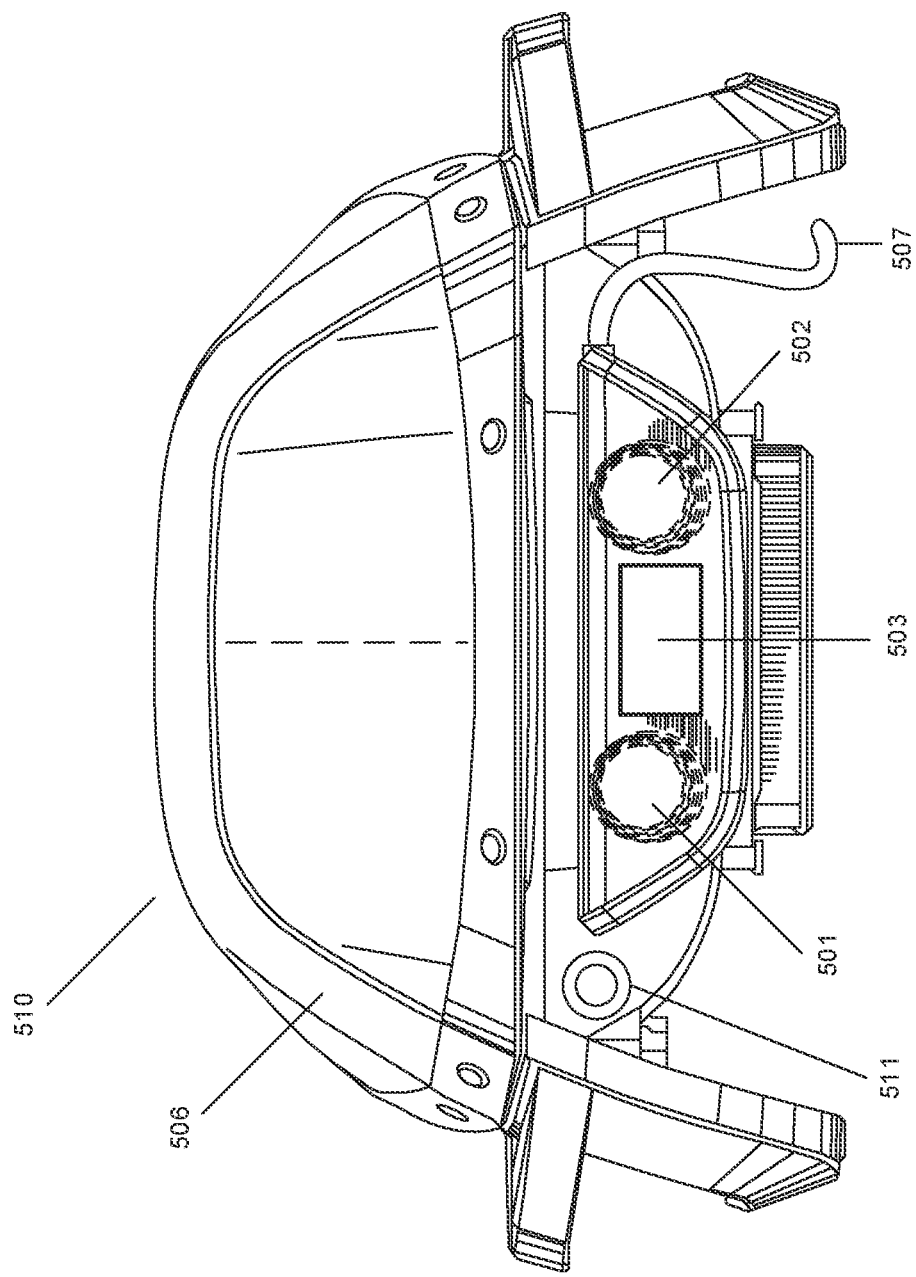
FIG. 1A is a front view of an exemplary electric grill of the present invention.

Set forth below is a description of what is currently believed to be the preferred embodiments or best representative examples of the inventions claimed. Future and present representative or modifications to the embodiments and preferred embodiments are contemplated. Any alterations or modifications which make insubstantial changes in function, purpose, structure or result are intended to be covered by the claims of this patent. The present inventions may be used on and/or part of electric grills with a digital power supply as discussed in the co-pending patent application entitled "Digital Power Supply" filed by Applicants and having application Ser. No. 15/200,759, and also the co-pending patent application entitled "Digital Power Supply with Wireless Monitoring and Control," filed on the same day as this application, both of which are assigned to Weber-Stephen Products LLC, and which are both incorporated herein by reference in their entirety.

The use of electric heating elements 103, 104 in harsh or outdoor environments creates a need for protection circuitry 100 that protects against dangerous current scenarios resulting from the potential failure or misuse of components in an electric grill 510. The environmental conditions—including sun, rain, wind, cleaning agents, food stuffs, and the like—may degrade electrical components and lead to short circuits, leaking current, or other dangerous conditions. In some instances, components may be permanently degraded. In other instances degraded components, such as heating elements 103, 104, may return to normal condition if they are cleaned or re-installed. In both instances, there is a need to restrict the flow of current to protect the user.

Protection circuitry 100 may protect against various failure scenarios, including, without limitation, instances of ground fault; overcurrent; driver failure; and failure of the microprocessor 113. For example, a ground fault (or unbalanced current) occurs when the current drawn by a device such as electric grill 510 does not match the current returned by the device to the wall outlet. Often times, this indicates a current leakage. Leaking current creates a hazard to a user, especially if the current reaches the electric grill's housing 506. In that case, the user may be shocked. In another failure scenario, degraded components may cause the electric grill 510 to draw an unsafe current load, leading to a so-called "overcurrent." That may result in component damage and eventually lead to leaking current. In yet another failure scenario, a heating element 103, 104 may receive a current load that is not necessarily unsafe, but is inconsistent with the heating element's operating mode. This inconsistency suggests a driver failure, which in turn may lead to unsafe conditions. A further failure scenario involves the failure of the microprocessor 113. Because the microprocessor 113 controls the current delivered to the heating element(s), its failure could potentially lead to unpredictable current loads. Aspects of the present invention are designed to disable current in the event one or more failure scenarios (including those identified above) are recognized.

FIGS. 1-10 show preferred embodiments of an electric grill 510 and a preferred protection circuity 100. By way of example, FIGS. 1A and 1B show a representative electric grill and some of its major components. FIG. 1A shows a preferred exterior of electric grill 510, including a housing and lid 506, onto which left and right control knobs 501 and 502, as well as display 503, may be mounted. The electric grill 510 includes a power cord 507 for connecting to an AC wall outlet. Left and right control knobs 501 and 502, and display 503, connect to a microcontroller 113 which is described in greater detail herein. A reset button 511 may also be provided for use as hereinafter described.

Figure 1B:
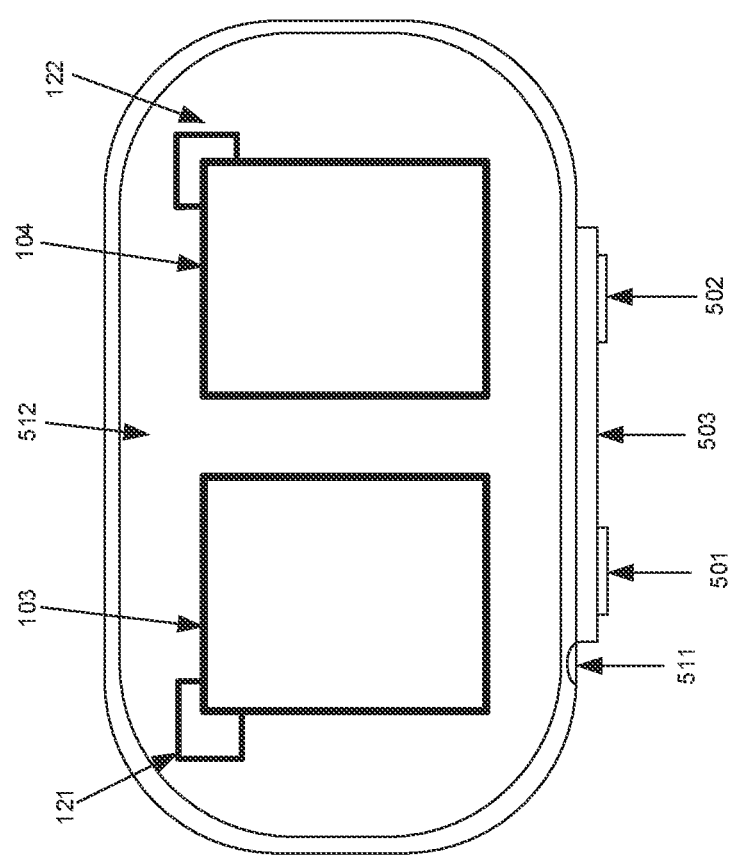
FIG. 1B is a top schematic view through a typical cooking surface of a representative electric grill of the present invention showing internal components.

As shown in FIG. 1B, left and right control knobs 501 and 502 may be associated with a first and second heating element, 103 and 104, respectively, thus creating dual cooking zones. A representative grate or cooking surface 512 is also shown in FIG. 1B. Each heating element 103, 104 may be controlled independently by a knob 501, 502 or other controller or user input associated with the heating element 103, 104. Left knob 501 and right knob 502 may be positioned on the exterior of a grill housing 506. The knobs 501 and 502, or any other input device that will be understood by those of skill in the art, may be connected to a microprocessor 113 to set the operating mode of one or more heating elements 103, 104. Although FIGS. 1A and 1B show two knobs 501, 502 controlling two heating elements 103, 104, it should be understood that protection circuitry 100 may be used with any combination of user input devices and heating elements, as will be understood by those of skill in the art.

Using knobs 501 and 502, or any other input device, a user typically selects an operating mode for one or both heating elements 103 and 104. The operating mode may include a desired temperature setting. Microprocessor 113, described in further detail herein, controls the electric current delivered to heating elements 103 and 104 in order to achieve the desired temperature setting. Microprocessor 113 can achieve a desired temperature for each heating element 103 and 104 using a feedback loop in which it receives a current or real time temperature reading from thermocouples 121 and 122, which may be proximally positioned by respective heating elements 103 and 104. It should be understood that, although thermocouples are shown as an example, any known temperature sensing device may be used. A person of ordinary skill in the art would recognize that various types and numbers of knobs, touch-pad, heating elements, temperature sensors and/or displays may be used.

The electric grill 510 preferably includes a display 503 and/or other user interface. The display 503 may be connected to microprocessor 113 and display information relating to the current settings or operation of one or more of the heating elements 103, 104. For example, the display 503 may show the current temperature of heating elements 103 and 104 (as measured by thermocouples 121 and 122), as well as the desired temperature a user has selected via knobs 501 and/or 502.

Figure 2:
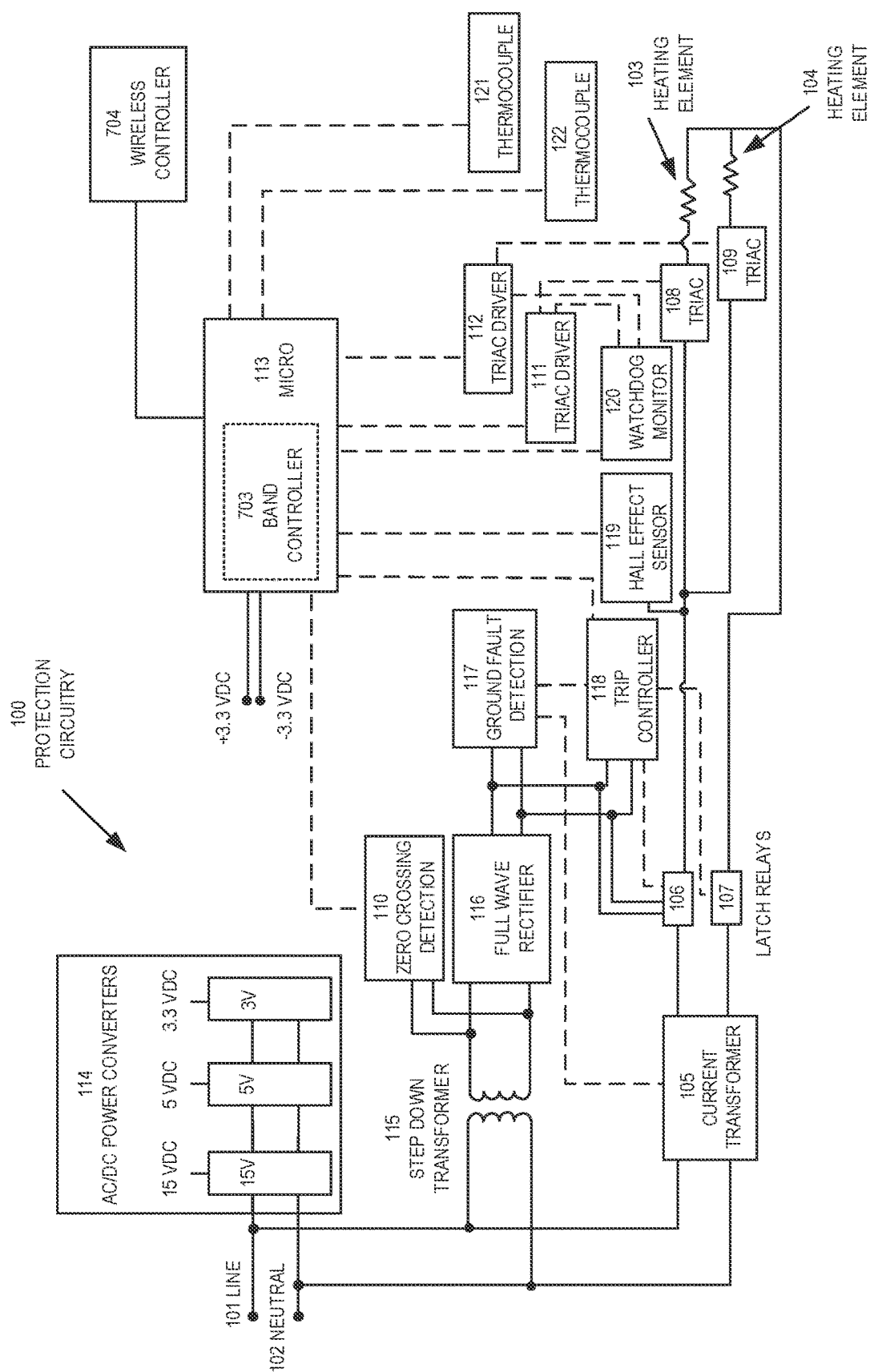
FIG. 2 is a schematic of an embodiment of a protection circuit of the present invention.
Figure 7:
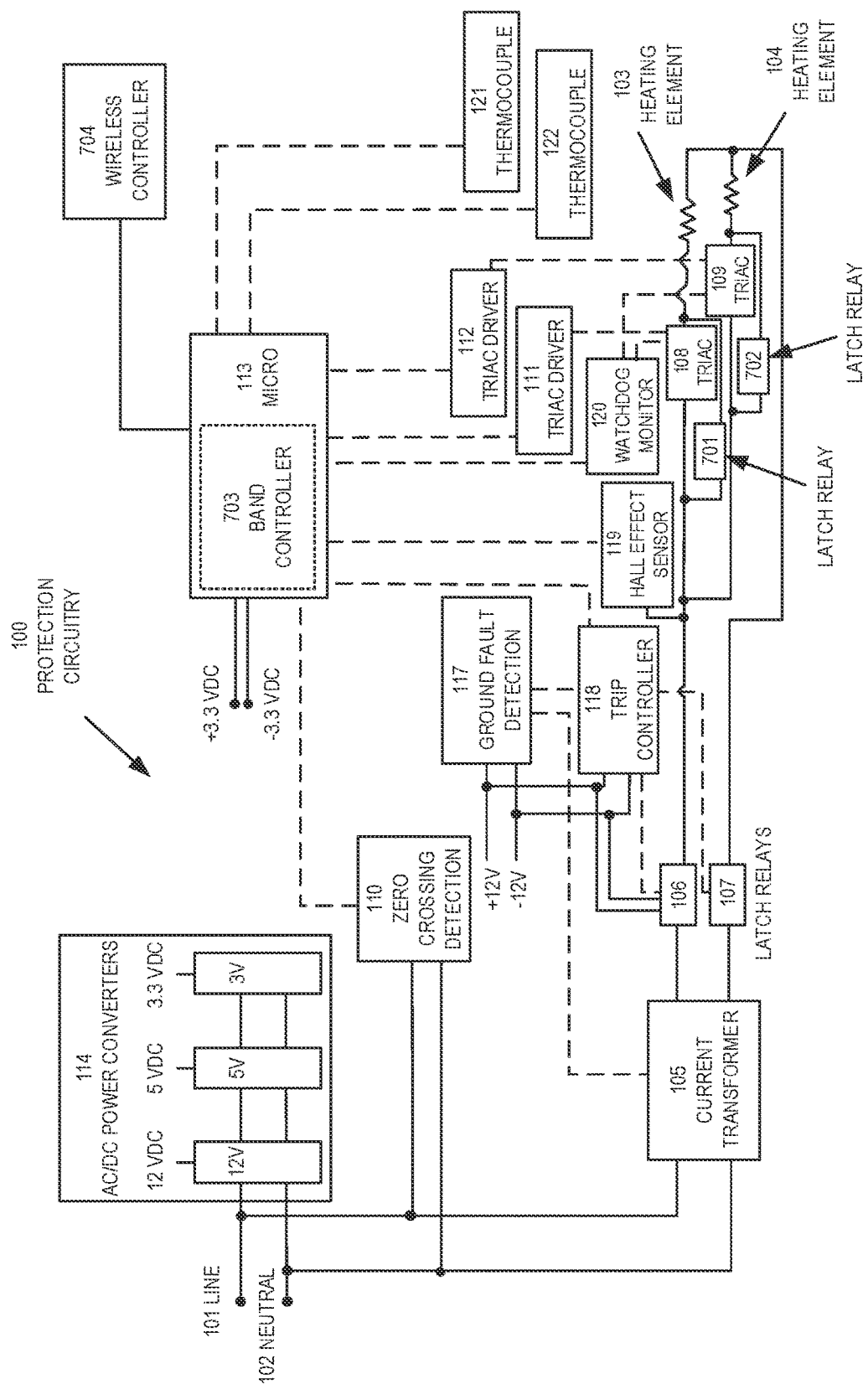
FIG. 7 is a schematic of an embodiment of a protection circuit of the present invention including a wireless controller.

A preferred embodiment of protection circuitry 100 is shown in FIGS. 2 and 7, where perforated lines represent control/data lines while solid lines represent power lines. In general, non-limiting terms, FIG. 2 shows hardware components and a specially configured microprocessor that can detect various failure conditions and respond by disabling the flow of current to the electric grill 510. Protection circuitry 100 includes a current transformer 105 for measuring a potential difference, if any, between current drawn by the device and current returned from the device. A ground fault detection unit 117 is provided to evaluate the difference, if any, and activate a trip controller 118, which would cause a latch relay 106 and/or 107 to create an open circuit and thus stop the flow of current. Moreover, a microprocessor 113 receives current readings from a Hall Effect sensor 119 and may use those current readings to detect various types of dangerous conditions. If a dangerous condition is detected, microprocessor 113 may activate the trip controller 118 to create an open circuit, or disable triac drivers 111 and/or 112 in order to prevent current from flowing to heating elements 103 and/or 104. A watchdog monitor may optionally be provided to communicate with microprocessor 113 and to disable triacs 108 and/or 109 in the event microprocessor 113 is not communicating normally.

Line 101 and neutral 102 may draw alternating current (AC) from a typical wall outlet. A traditional power cord 507 may be used to plug line 101 and neutral 102 into an AC wall outlet using typical fixtures. Line 101 and neutral 102 also connect to a set of one or more AC/DC power converters 114 which supply the basic power needs of various components including display(s) and/or microprocessor(s). The power converters 114 convert the alternating current to direct current having lines of 3.3 Volts DC, 5 Volts DC, and 15 Volts DC. These DC lines may be used to power various components on the electric grill, such as one or more displays, microprocessor(s), etc. A person of ordinary skill would recognize that the AC/DC power converters 114 can be used to supply any level of DC voltage required by any of the electric grill's components.

Line 101 and neutral 102 further connect to current transformer 105, which measures the difference, if any, between current going to heating elements 103 and/or 104 from line 101, and current returning to neutral 102. A potential difference in current, if any, is signaled to ground fault detection unit 117, which evaluates the difference in current to determine if current is leaking. In other words, if damage to the circuit (whether temporary or permanent) has caused electric current to leak from any of the components, then the current returning through neutral 102 will be less than the current drawn in line 101. Ground fault detection unit 117 detects that there is electric current missing. Missing current is indicative of a dangerous operating condition because it may come in contact with the user, causing an electric shock, or cause other components to fail.

In such a scenario, a desired response is to stop the flow of any current in order to avoid the risk of shock, electrocution or component damage. To cause current to stop flowing, ground fault detection unit 117 activates a trip controller 118, which in turn opens electro-mechanical latches 106 and 107. As shown in FIG. 2, latches 106 and 107 are positioned in series with heating elements 103 and 104; thus, tripping a latch causes an open circuit, which, by definition, stops the flow of current. Latch relays 106 and 107 may be electro-mechanical switches for creating an open circuit and may be connected via a control line to trip controller 118. When tripped, latch relays 106 and 107 may remain open until a user engages a mechanical switch. As one example, a reset button 511 or other mechanical switch on the housing 506 may be associated with the latch relays 106 and 107 to reset them into a closed position after they have been tripped.

Figure 4:
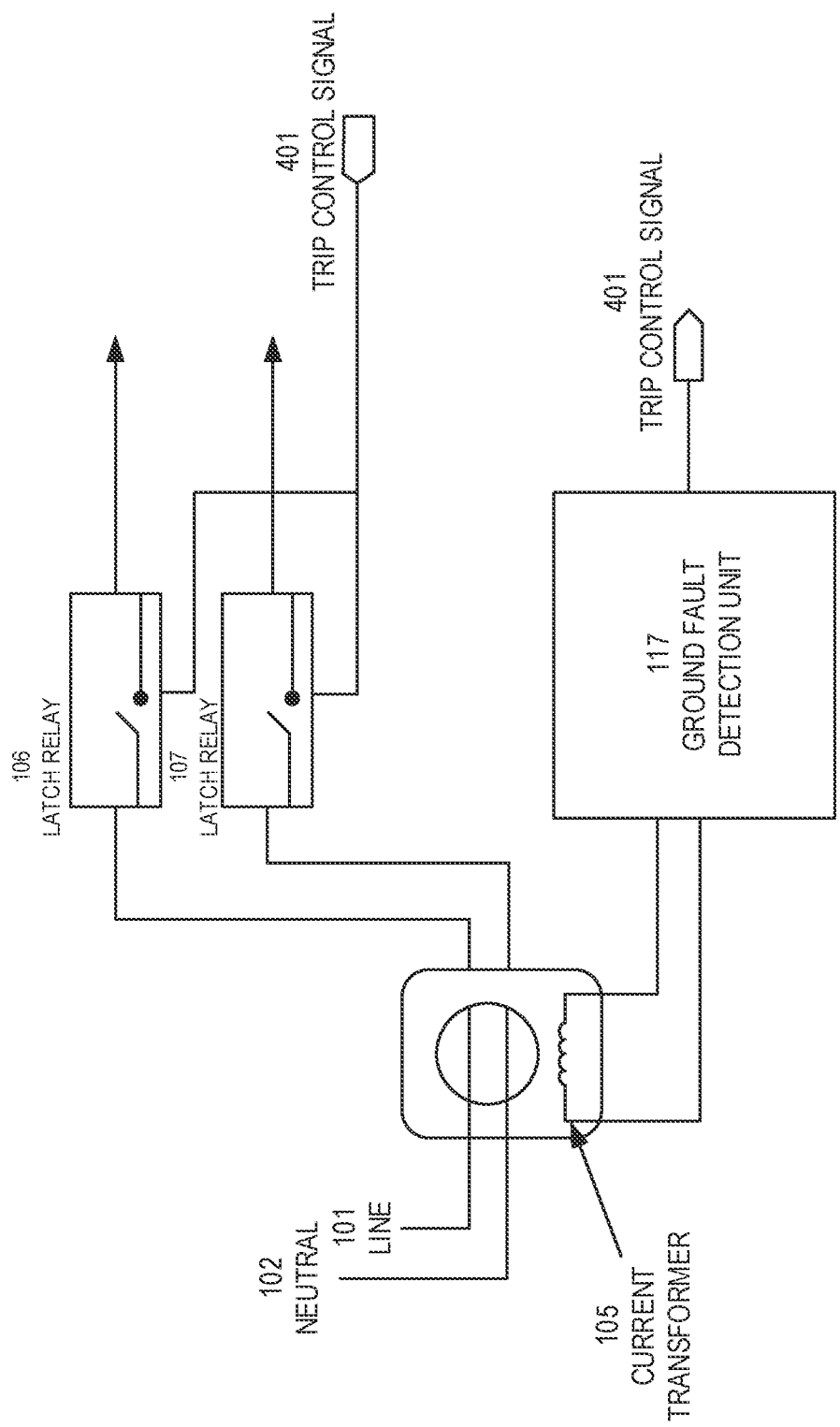
FIG. 4 is an exemplary schematic showing an isolated view of a current transformer used to generate a trip control signal of the present invention.

An exemplary embodiment of ground fault detection unit 117 interacting with latch relays 106 and 107 is best shown in FIG. 4. As a non-limiting example, ground fault detection unit 117 may be a ground fault interrupter such as part number FAN4146ESX, made by Fairchild Semiconductor. The current transformer 105 is positioned to measure the current difference, which is read by ground fault detection unit 117. Ground fault detection unit 117 generates a trip control signal 401 if the current difference exceeds a safety threshold, in which case trip control signal 401 is fed back to latch relays 106 and 107, creating an open circuit and stopping the flow of current. A user turning on a device in which current is leaking will be protected because the tripping of latch relays 106 and 107 will cause an open circuit, thereby minimizing the risk of electric shock to the user or further damage to the equipment. A person of skill in the art would recognize that a certain tolerance in current difference may be allowable.

Again by reference to FIG. 2, a step-down transformer 115 is provided because ground fault detection unit 117 operates at a lower voltage than that drawn from line 101 and neutral 102. Line 101 and neutral 102 are connected to step-down transformer 115, which provides a lower secondary voltage through a full wave rectifier 116 to ground fault detection unit 117 and also to a trip controller 118. The step down transformer 115 has the benefit of isolating the ground fault detection unit 117 and trip controller 118 from the high voltage of line 101 and neutral 102. Instead, they operate at the lower secondary voltage. A person of skill in the art would recognize that step-down transformers are used to isolate components operating at a lower voltage. Step down transformer 115 has the additional benefit of separating ground fault detection unit 117 from microprocessor 113, which provides added protection in the event that microprocessor 113 fails during a ground fault/unbalanced current. Microprocessor 113's failure would not prevent ground fault detection unit 117 from recognizing a ground fault/unbalanced current. Likewise, a failure of ground fault detection unit 117 would not prevent microprocessor 113 from continuing to monitor current conditions.

During normal operation, microprocessor 113 controls the heat and temperature setting by controlling the flow of electricity to heating elements 103 and 104. Microprocessor 113 may also be configured to detect and respond to abnormal operating conditions, i.e. conditions having an increased risk of electrocution, shock or component damage. A discussion of microprocessor 113's functionality during normal operating conditions is provided, followed by specific configurations that allow microprocessor 113 to detect and respond to failure conditions.

During normal operating conditions, microprocessor 113 controls the electricity (and thus, the heat and temperature) to heating elements 103 and 104 from line 101 and neutral 102. The electric path runs through line 101 and neutral 102, which are connected through current transformer 105, and further through a series of latch relays 106 and 107 and triacs 108 and 109. As will be understood, triacs are three electrode devices, or triodes, that conduct alternating current. Triacs are a type of solid state bidirectional switch. The protection circuit 100 disclosed herein describes the use of triacs to control current flowing to heating elements 103 and 104, however it will be understood that other solid state bidirectional switches may be used in place of a triacs consistent with the present inventions. Heating elements 103 and 104 may be resistive heaters which increase in temperature as more current passes through them. Other types of heating elements 103, 104 may also be used as will be understood by those of skill in the art.

Triac drivers 111 and 112 control triacs 108 and 109 by "opening" and "closing" them to allow or prevent current from passing to heating elements 103 and 104. A person of ordinary skill in the art would recognize that triac drivers are used to control a high voltage triac with a low voltage DC source (such as a microprocessor) (FIG. 2). Moreover, triac drivers 111, 112 are used to isolate devices from a potentially high current or voltage in a triac. Triac drivers 111 and 112 interface between microprocessor 113 and triacs 108 and 109 while at the same time keeping microprocessor 113 isolated from voltages and currents in triacs 108 and 109.

In order to achieve a user's desired temperature during normal operation, microprocessor 113 controls current delivered to the heating elements 103 and 104 by activating (or deactivating) triacs 108 and 109 via their triac drivers 111, 112. In other words, microprocessor 113 controls the current drawn, and thus the temperature, of heating elements 103 and 104 by controlling the triac drivers 111 and 112. A disabled triac 108 and/or 109 creates an open circuit through which no current can flow.

To recognize when a desired temperature has been achieved, microprocessor 113 may receive temperature feedback from one or more thermocouples 121 and 122 located proximately to each heating element 103 and 104, or elsewhere throughout the cook box. FIG. 1B shows a representative example of thermocouples 121 and 122 adjacent to each heating element 103 and 104. The feedback is used by microprocessor 113 to adjust the current delivered to the heating elements 103, 104 until the desired temperatures selected by knobs 501 and/or 502 is achieved. As a result, a user can select a desired operating mode (independently) for heating elements 103 and 104 and microprocessor 113 will control the current delivered until a desired temperature setting is reached.

Figure 5:
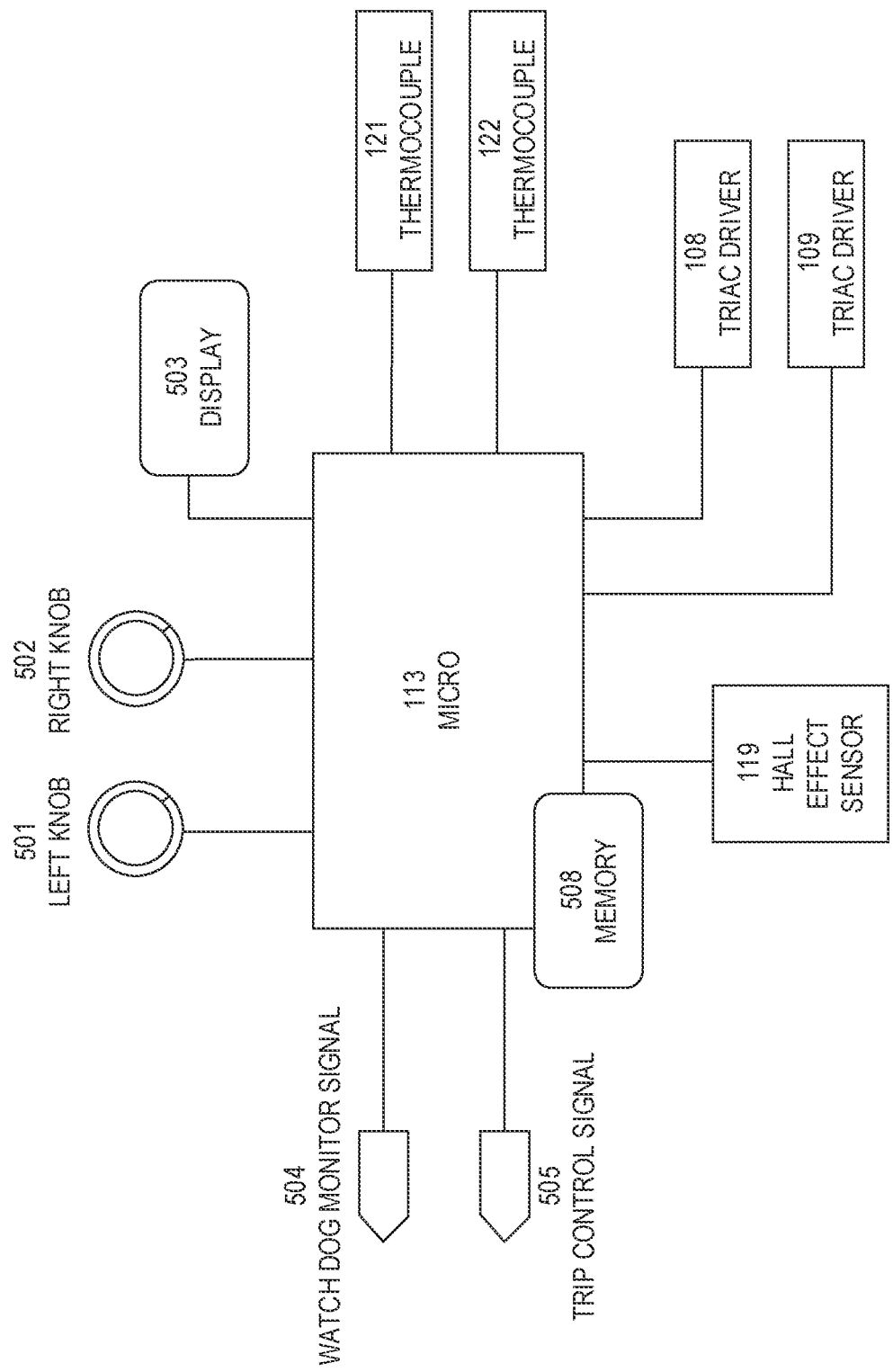
FIG. 5 is an isolated diagram of a microprocessor and exemplary inputs and outputs that may connect to the microprocessor of the present invention.

FIG. 5 shows exemplary inputs and outputs to and from microprocessor 113, which can use the feedback from the thermocouple 121 and/or 122 to adjust current flowing to a heating element 103 and/or 104 until a desired temperature is reached. The desired temperature may be selected by a user through a user interface, such as knobs 501 or 502, and communicated electronically to microprocessor 113. A person of ordinary skill in the art would know understand that the microprocessor 113 may include and communicate with an internal or external memory 508 containing the software instructions for executing the calculations and comparisons, as well as other settings described herein.

As an optional input example, microprocessor 113 may receive a control signal from a zero crossing detection unit 110 (FIG. 2). The zero crossing detection unit 110 sends a control signal each time the alternating current, as measured through step down transformer 115, crosses zero. Using this signal, microprocessor 113 can identify the present status of an alternating current's wave form. Tracking the zero crossings enables microprocessor 113 to turn triacs 108 and 109 on and off in a manner that reduces the harmonics introduced.

Figure 3:
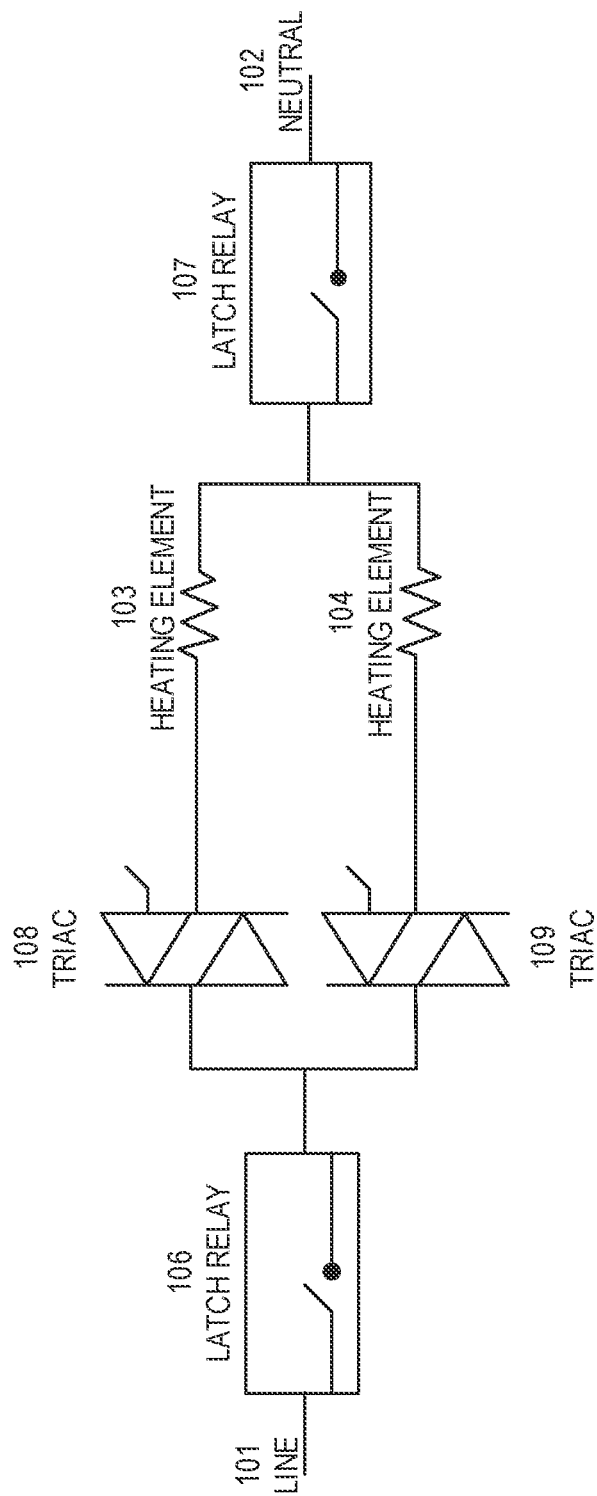
FIG. 3 is an exemplary schematic showing an isolated view of one or more heating elements driven by one or more triacs of the present invention.

Microprocessor 113 may be configured to identify dangerous conditions that arise during normal operation. Although ground fault detection unit 117 detects a leaking current, there are other dangerous conditions that microprocessor 113 is specifically configured to detect and respond to. As seen in FIG. 2, microprocessor 113 is in communication with trip controller 118 and triac drivers 111 and 112, thus giving microprocessor 113 two different ways to stop a flow of current—by tripping a latch 106 or 107, or by disable triacs 108 and/or 109 if it detects a failure condition. For example, FIG. 3 shows that heating elements 103 and 104 are in series with triacs 108, 109 and with latches 106, 107. As a practical matter, opening one of the latches 106, 107 or both of the triacs 108, 109 will stop the flow of all current.

As one example, microprocessor 113 may be configured to respond to an "overcurrent" scenario. Overcurrent conditions are dangerous because they are associated with an increased risk of component failure and/or damage to electronic circuitry, which in turn may be a precursor to current leakage. An overcurrent scenario occurs when a circuit draws more current than it is safely rated to handle. An overcurrent may occur if a harsh environment causes the resistance value of some components, such as heating elements, to change, resulting in a higher current draw. However, an overcurrent scenario does not necessarily correlate to a mismatch in current. Therefore, ground fault detection unit 117 may not detect an overcurrent and it may be desirable to configure microprocessor 113 to recognize it. To that end, a Hall Effect Sensor 119 sends microprocessor 113 a current reading indicative of the current flowing through triacs 108 and 109. A Hall Effect sensor 119 measures the current being delivered through one or more of the triacs and to heating elements 103 and 104. The protection circuitry described herein discloses a Hall Effect sensor 119 that is used to measure current, but a person of skill in the art would recognize that any suitable current sensor may be used in place of Hall Effect sensor 119. The Hall Effect sensor 119 is connected to microprocessor 113 via a control line to convey to microprocessor 113 how much current is being delivered through the heaters 103, 104.

The Hall Effect sensor 119 measures the current delivered to heating elements 103 and 104 and sends a current measurement to microprocessor 113 via a control/data line.

Figure 6:
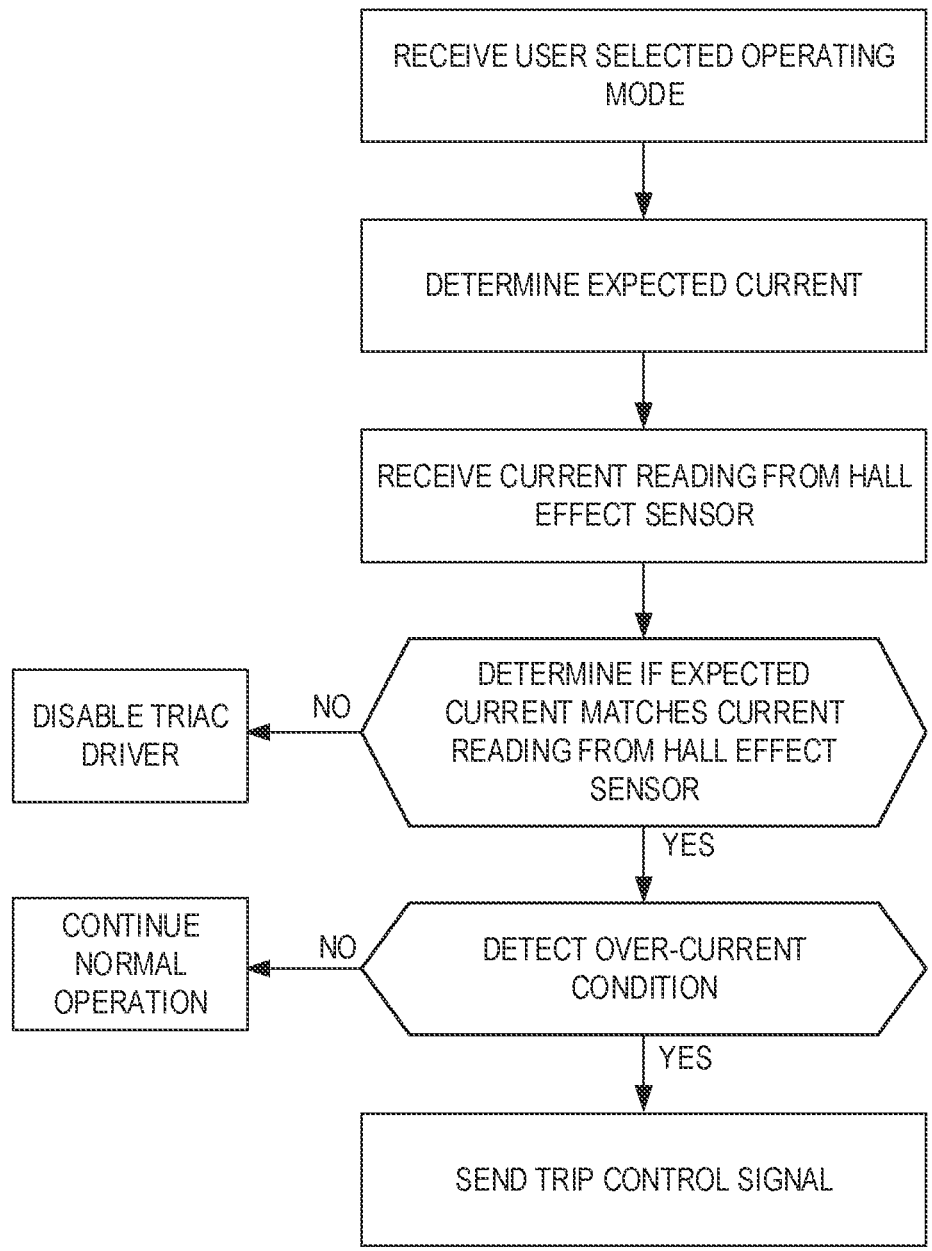
FIG. 6 is a flow chart showing a microprocessor detecting an unexpected current or overcurrent condition of the present invention.

The Hall Effect sensor 119 may be configured to measure the current through the voltage line 101, or to measure both of the two currents going to the individual heating elements 103 and 104. In either configuration, the current reading is communicated to the microprocessor 113. FIGS. 2 and 5 show a connection between microprocessor 113 and Hall Effect sensor 119. FIG. 6 shows microprocessor 113 sending a trip control signal if it detects an overcurrent condition. In FIG. 2, Hall Effect Sensor 119 is shown to measure the combined current in the power line leading to triac 108 and 109. A person of ordinary skill in the art would recognize that a possible alternative configuration would be to connect one Hall Effect sensor to the node of each triac, thereby measuring the current to each individual triac rather than the combined current.

To recognize an overcurrent condition, microprocessor 113 compares the current reading from Hall Effect Sensor 119 with a predetermined threshold current level at which the circuit may safely operate. The predetermined threshold is the threshold for an overcurrent condition. The predetermined threshold current level may be chosen based on any number of considerations, including the maximum current at which the heating element 103, 104 may operate, or the maximum current at which any of the other components in the circuit may operate. Microprocessor 113 compares the current measured by Hall Effect sensor 119 to the predetermined threshold current level. If the current exceeds the threshold, there exists a potential overcurrent condition and the flow of current should be stopped. To stop the flow of current, microprocessor 113 sends a trip control signal 505 to trip controller 118, which is connected via control/data line. Trip controller 118 responds by tripping latch relays 106 and 107, causing an open circuit with respect to the heating elements and thereby stopping the flow of current. Exemplary inputs from the Hall Effect sensor 119 to microprocessor 113, and the trip control signal 505 from microprocessor 113, are shown in FIG. 5.

In some embodiments, microprocessor 113 may additionally be configured to recognize when heating elements 103 and 104 draw a current that is within a safe range, but which is different from the current expected to be drawn given a heating element's selected operating mode. For example, a potentially dangerous scenario may occur when a heating element is set to a "LOW" temperature but drawing current reserved for a "HIGH" temperature, or vice versa. If a user has set a heating element 103 and/or 104 to a high temperature, but only a low current is being delivered, it is likely a component has failed. Possible causes of such a scenario include, without limitation, a harsh or caustic environment corroding Hall Effect sensor 119 or a failure of triacs 108, 109 or triac drivers 111, 112.

Microprocessor 113 may use a feedback loop from thermocouples 121 and 122 to deliver current to a heating element 103 and/or 104 until a desired temperature is achieved. The desired temperature may then be maintained at a steady state. A person of ordinary skill would recognize that raising the temperature of a heating element 103 or 104 draws more current than maintaining the temperature. By way of example, if a user activates electric grill 510 and selects a "HIGH" temperature, microprocessor 113 must deliver a high current to the relevant heating element 103 and/or 104 until a "HIGH" temperature has been achieved. Once microprocessor 113 recognizes that the desired "HIGH" temperature has been achieved (for example via feedback from thermocouples 121 and 122), microprocessor 113 can reduce the current delivered in order to maintain the temperature at a steady state.

Examples of how the heating elements may operate include discrete modes, such as "HIGH," "MEDIUM," "LOW," or on a continuous spectrum measured for example in % or by a temperature. Since a higher current results in a heating element having higher temperature, a person of skill in the art would recognize that raising the temperature of heating elements 103 and 104 would draw more current than maintaining a steady state temperature.

To identify an unexpected current condition, microprocessor 113 is configured to compare a current reading from Hall Effect sensor 119 with an expected current. The current which microprocessor 113 is configured to deliver to the heating elements in any given mode (accounting for whether microprocessor 113 is raising a temperature or maintaining a steady state) is the "expected current" because it is expected to match the reading from Hall Effect sensor 119 during normal operating conditions. In other words, during normal operating conditions, the current reading from Hall Effect sensor 119 is expected to match the expected current, i.e. the current microprocessor 113 is programmed to deliver. If the current reading from Hall Effect sensor 119 does not match the expected current, it is likely that a driver failure has occurred.

The expected current value may be accessible to microprocessor 113 through internal or external memory 508. In this way, microprocessor 113 is programmed to recognize the total amount of current that should be drawn by a normally-functioning heating element or elements in any given operating mode (or combinations of operating modes).

Should a failure condition arise, microprocessor 113 responds by disabling triac drivers 111 and 112, thereby opening the respective triacs and cutting current through the heating elements 103 and/or 104. In one embodiment, microprocessor 113 may optionally be programmed to re-enable the flow of current after a predetermined amount of time has passed, and to continue monitoring the current drawn. Re-enabling the flow of current may be desirable because the cause of the failure may have been temporary. By way of non-limiting example, a temporary failure condition that quickly stabilizes may be detected if the electric grill 510 was recently turned on/off, or if a temporary irregularity occurred in the power grid.

FIG. 6 is a flow chart showing microprocessor 113 determining an expected current based on the electric grill's 510 operating mode, and comparing the expected current to an actual current reading received from the Hall Effect sensor 119. If a mismatch is detected, triac drivers 111 and 112 are disabled. Moreover, FIG. 6 also shows microprocessor 113 comparing a current reading from the Hall Effect 119 sensor to an overcurrent threshold, and responding to an overcurrent condition by sending trip control signal 505. A person of ordinary skill in the art would recognize that these steps and comparisons could be performed in any order and in a number of different implementations, all of which are contemplated by the present inventions. Microprocessor 113 may repeat these operations on any desired or periodic basis.

In yet another failure example, protection circuit 100 protects against a failure of microprocessor 113. Because microprocessor 113 controls current delivered to heating elements 103 and 104, its failure could lead to unpredictable results that may include unsafe levels of current. To protect against a failure of microprocessor 113, the circuit 100 may include a watchdog monitor 120 connected between microprocessor 113 and triacs 108 and 109 as shown in FIG. 2.

In this situation, microprocessor 113 sends a watchdog monitor signal 504 to watchdog monitor 120 which confirms that microprocessor 113 is operating normally. Watchdog monitor 120 is configured to look for a signal from microprocessor 113 confirming its normal operation. Watchdog monitor 120 is also connected to triacs 108 and 109. In the absence of a signal from microprocessor 113 confirming normal operation, watchdog monitor 120 disables the triacs 108 and 109, thus preventing current from flowing to them. If microprocessor 113 subsequently returns to normal operation, watchdog monitor 120 may re-enable the flow of current. This configuration of watchdog monitor 120 allows the possibility that microprocessor 113 may return to normal operation after a period of malfunction or resetting. This is advantageous because it allows for continued operation even in scenarios where the microprocessor 113 is booting or rebooting. In other words, if the microprocessor 113 is in the process of rebooting (intentionally, or unintentionally), watchdog monitor 120 may determine that microprocessor 113 is not operating normally and disable the flow of current. But normal operation may resume once microprocessor 113 completes its boot sequence and resumes sending its signal to watchdog monitor 120.

FIG. 7 shows additional embodiments of the inventions. For example, shown in FIG. 7 is an embodiment in which zero crossing detection unit 110 is connected directly to line 101 and neutral 102, without any intermediary transformer. Also shown is an embodiment in which ground fault detection unit 117 is connected to power (in this case, 12 V, but other voltages are also contemplated) through the AC/DC power converters 114. Zero crossing detection unit 110 and ground fault detection unit 117 may perform the functions described herein when configured as shown in FIG. 2, FIG. 7, or any other number of configurations.

FIG. 7 further discloses relays 701 and 702, which are configured in parallel with TriACs 108 and 109, respectively. Relays 701 and 702 are controlled via control line (not shown) by microprocessor 113 for controlling the delivery of current to heating elements 103 and 104, respectively. Because of the parallel configuration between relays 701, 702 and TriACs 108, 109, current can be delivered to the heating elements 103, 104 by activating either a relay or a TriAC. Stated another way, microprocessor 113 can use either the respective TriAC 108, 109 or the respective relay 701, 702 to deliver current to heating elements 103, 104.

An advantage of having two components (a relay and a TriAC) which can each deliver current to the heating elements 103, 104, is that microprocessor 113 can alternate between the two components to reduce heat generation. For example, delivering 100% power to heating elements 103, 104 may cause TriACs 108, 109 to overheat when active. More specifically, heating elements 103, 104 may draw a relatively high amount of current when a high temperature is desired, and delivering said current through TriACs 108, 109 for a prolonged period of time may cause TriACs 108, 109 to overheat and eventually deteriorate. To avoid this, microprocessor 113 may deactivate TriACs 108, 109 and instead activate relays 701, 702 when delivering a "HIGH," or relatively high current to heating elements 103, 104. Current then flows to heating elements 103 and/or 104 through relays 701 and/or 702, respectively, thereby protecting TriACs 108, 109 from overheating.

FIG. 7 further shows an embodiment of microprocessor 113 having the functionality of band controller 703. A person of skill in the art, having the benefit of this disclosure, would understand that band controller 703 may be a physical and/or virtual subcomponent of microprocessor 113, or may alternatively be a separate hardware and/or software component. In embodiments of the inventions, band controller 703 may be configured to receive a target temperature via a user input (including wireless inputs), and to control the amount of power (i.e. current) delivered to heating elements 103, 104 to achieve the user-selected target temperature.

Band controller 703 may use hardware and software applications to achieve and maintain target temperatures at heating elements 103, 104 by controlling the amount of current delivered. Band controller 703 may receive feedback from thermocouples 121, 122, which may be positioned proximate to heating elements 103, 104, and use such feedback to determine when a target temperature has been achieved. In embodiments of the inventions, it may be desirable to estimate the ambient temperature within the grill's cook box using thermocouples 121, 122. There are scenarios in which the ambient temperature (e.g. the temperature at a position of six or eight inches above the heating elements) may not be identical to the temperature at heating elements 103, 104, especially when operating at higher temperatures. Because food may be positioned throughout a grill's cook box, for example on a grate positioned a few inches above heating elements 103, 104, it may be desirable for band controller 703 (and microprocessor 113) to operate based on an estimated ambient temperature, rather than the temperature at heating elements 103, 104. Operating based on the ambient temperature provides a more precise measurement of a food's temperature, and therefore a more precise measurement of a food's doneness.

Figure 10:
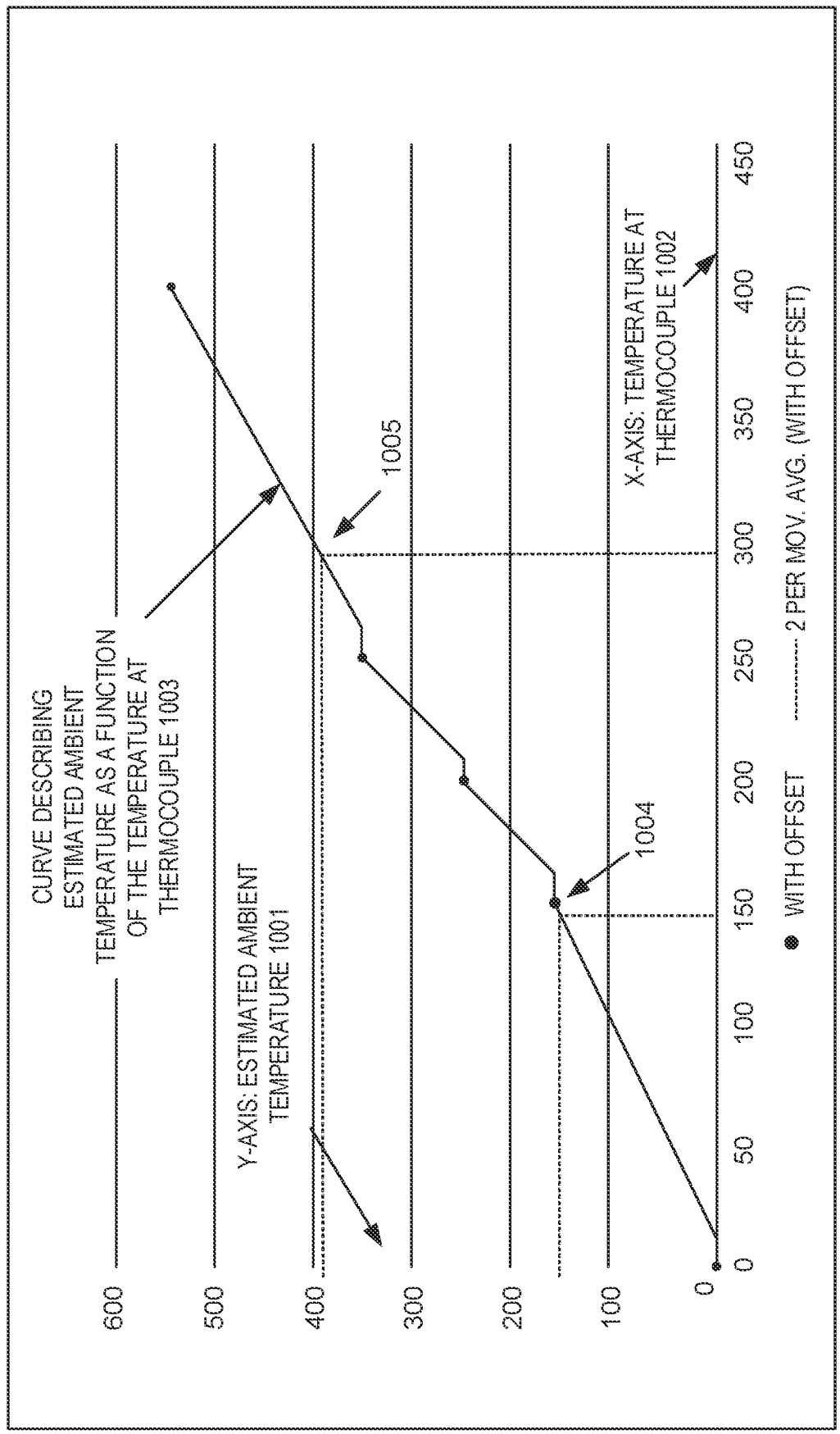
FIG. 10 is an exemplary graph showing estimated ambient temperatures inside a grill box based on measurements taken near a grill's heating elements.

By way of example, FIG. 10 shows Applicants' test data for accurately estimating the ambient temperature 1001, based on the temperature 1002 at thermocouples 121, 122. On its x-axis, FIG. 10 shows a temperature 1002 measured at thermocouples 121, 122. On its y-axis, FIG. 10 shows a corresponding estimated ambient temperature 1001. The curve 1003 shows the estimated ambient temperature (y-axis) as a function of the measured temperature (x-axis). The estimated ambient temperature of FIG. 10 was measured a few inches above a heating element, at a position where a user may configure a cooking grate. It becomes clear that, at higher temperatures, the ambient temperature diverges from the measured temperature at the thermocouples—in other words, at higher temperatures, the estimated ambient temperature at a position above a heating element rises faster than the temperature of the heating element. By way of example, at reference point 1004, the estimated ambient temperature and the temperature at the thermocouples 1002 are both roughly equal, at 150 F. At a higher temperature (e.g. reference point 1005), the temperature at the thermocouple may be 300 F, whereas the estimated ambient temperature has risen to approximately 400 F. Thus, at higher temperatures, a higher offset is required in order to accurately estimate the ambient temperature.

Using the offsets indicated by FIG. 10, microprocessor 113, and/or band controller 703, may be adapted and configured with hardware and/or software to calculate an estimated ambient temperature based on a measured temperature at thermocouples 121, 122. It should be understood that the offsets of FIG. 10 are provided as an example only, and may be increased or decreased depending on factors such as the height of a cooking grate, and other factors which may affect ambient conditions. Moreover, microprocessor 113 and/or band controller 703 may use such an estimated ambient temperature as part of a feedback loop to determine when a target temperature is reached. In other words, in some embodiments, a target temperature may refer to the estimated ambient temperature, and in other embodiments it may refer to the temperature at thermocouples 121, 122.

It is contemplated that yet further embodiments may use a food probe (not shown) to measure a food's temperature and determine when a target temperature is reached based on a temperature reading from the food probe. A food probe is a temperature sensing device which may be inserted by a user into a food—such as a steak or a chicken breast—to measure the food's internal temperature. Using a food probe to sense temperature may be advantageous to some cooking styles because it can provide an accurate determination of a food's internal temperature, and by extension its doneness.

To consistently maintain a target temperature, band controller 703 may determine temperature "bands" surrounding a given target temperature, where said bands indicate the amount of power (i.e. current) to deliver to a heating element 103, 104 as a target temperature is approached. In embodiments of the inventions, the bands create zones representing 0%, 50%, and 100% power. The zone above 801 represents a temperature zone in which 0% power is delivered; the zone between 801 and 803 represents a zone in which 50% power is delivered, and the zone below 803 represents 100% power delivery. Band controller 703 uses the bands to determine an appropriate power (e.g. electric current) to deliver to a heating element to achieve and maintain the desired target temperature. By way of example, seen for example in FIG. 8A, band controller 703 may deliver 100% power until a desired target temperature 802 is achieved, and then reduce power to 50% until an upper band 801 is reached. If the upper band 801 is exceeded, band controller 703 reduces power to 0%. If the temperature drops to (or below) a lower band 803, power is again increased to 100%. Band controller 703 continuously receives feedback from thermocouples 121, 122, and compares the feedback (in some embodiments, the estimated ambient temperature described above) to appropriate temperature bands. In this way, temperature fluctuates between lower band 803 and upper band 801, and approximates the target temperature.

Figure 8B:
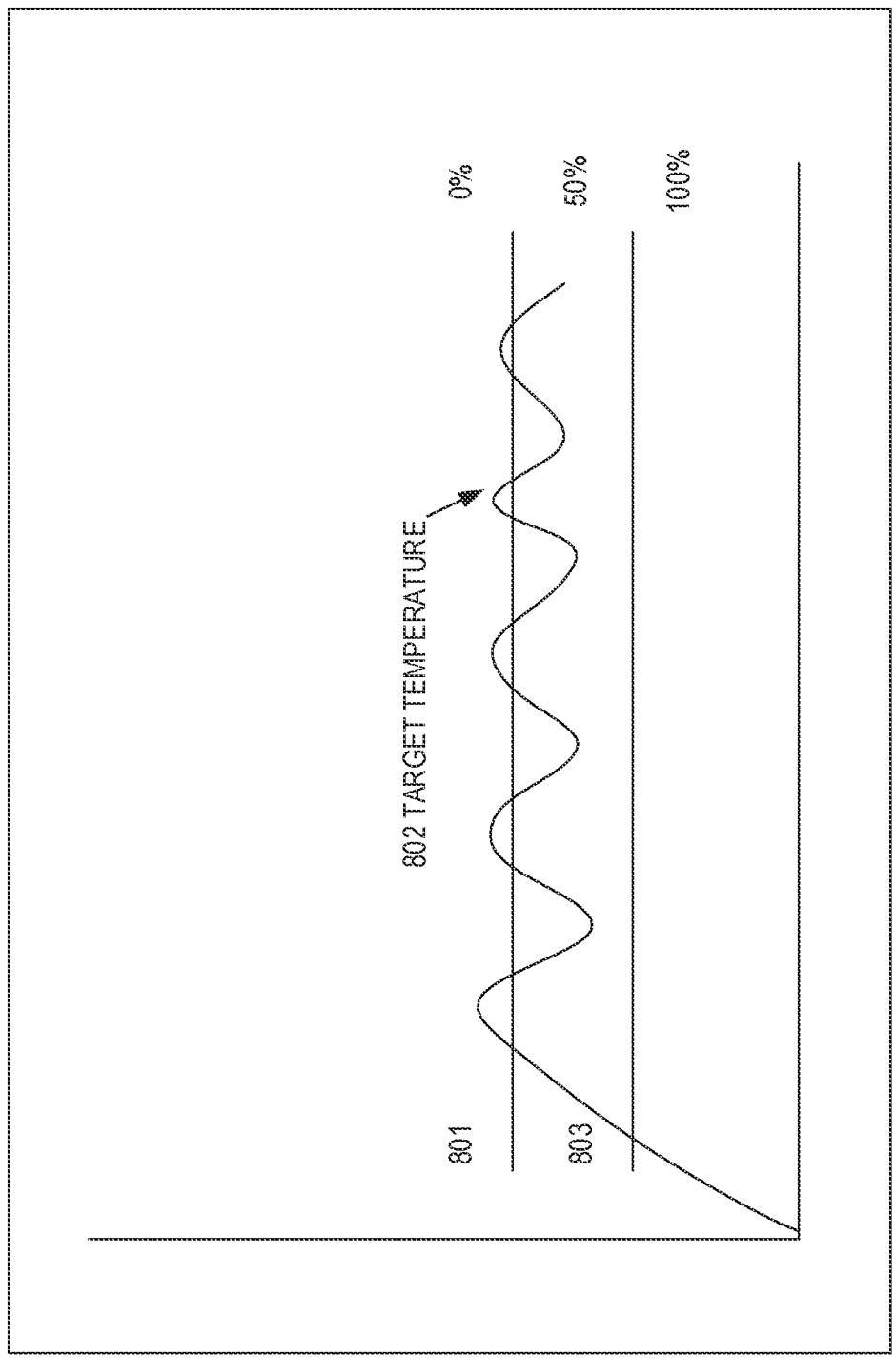
FIG. 8B is a graph showing exemplary temperature fluctuations of an electric grill operating in a low temperature range.

Moreover, in embodiments of the invention, band controller 703 dynamically shifts the bands depending on the desired target temperature. Dynamically shifting the temperature bands allows for more precise temperature control, allowing a user to approximately maintain the selected target temperature. This occurs because, at lower temperatures, a 50% power setting may cause the electric grills temperature to continue increasing past the desired target temperature. On the other hand, at higher temperatures, delivering 50% power may cause the temperature to begin dropping below the desired target temperature. Therefore, band controller 703 may compensate by lowering the bands for a lower desired target temperature. On the other hand, at a higher temperature range, band controller 703 may shift the bands higher. An example of lowered temperature bands corresponding to a lower desired target temperature is shown in FIG. 8B. In FIG. 8B, a lower target temperature has been selected, and band controller 703 shifted the upper band (801) to correspond to the target temperature. Conversely, FIG. 8C shows a relatively high target temperature, for which band controller 703 raised the power bands such that the target temperature 802 coincides with the lower band (803). In FIG. 8B, the target temperature overlaps with the power band 801; whereas in FIG. 8C the target temperature 802 overlaps with the power band 803. Exemplary values for power bands are provided in the following table:

| Desired target temperature (T) | Lower temperature band (100%) | Upper temperature band (0%) |
|---|---|---|
| T < 250 F. | T − 25 F. | T |
| 250 F. < T < 400 F. | T − 10 F. | T + 10 F. |
| 400 F. < T | T | T + 15 F. |

Figure 9:
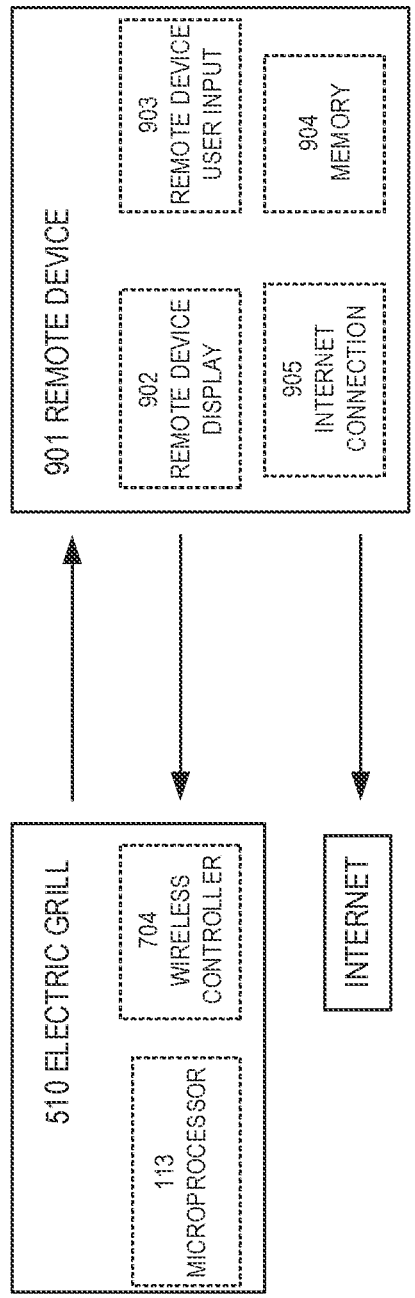
FIG. 9 is an exemplary schematic of an electric grill in wireless communication with a remote device.

In embodiments having multiple heating elements capable of independent operation, users can input multiple target temperatures. For example, an embodiment having two independent heating elements 103, 104, may receive two separate target temperatures, each corresponding to one heating element. Target temperatures may be communicated to band controller 703 through any number of possible user inputs. By way of non-limiting examples, possible user inputs include knobs 501, 502. User inputs can also be received wirelessly, via wireless controller 704, from a wireless device configured to communicate with wireless controller 704. In such an embodiment, wireless controller 704 may be configured to wirelessly communicate with a remote device via Wi-Fi, Bluetooth, radio frequency, or any other form of wireless communication. Remote devices include cell phones, tablets, laptops, computers, and any other form of device capable of wireless communication. FIG. 9 shows an exemplary remote device 901, having a display 902 and user input device 903, communicating with the electric grill 510's wireless controller 704. In a non-limiting example, remote device 901 may be a cell phone with a touch screen as its input device 903. Regardless of the type of device used, it is contemplated that remote device 901 may be configured to receive a user input representing, among other things, one or more target temperatures, and wirelessly communicate said target temperature to electric grill 510 via wireless controller 704.

In exemplary embodiments, remote device 901 may be adapted and configured to directly receive a desired target temperature from a user. In such embodiments, a user can use input device 903 to select a target temperature. In other exemplary embodiments, remote device 901 may be adapted and configured to receive a user input selecting a type of meat to be cooked, and a desired doneness, and to determine the appropriate target temperature for the user's selection. In such embodiments, remote device 901 may have a memory 904 storing the appropriate target temperature associated with a desired food profile. A user thus uses input device 903 to select a food profile, and remote device 901 wirelessly communicates the associated target temperature. In addition to controlling target temperatures, embodiments of remote device 901 are adapted and configured to send an "on" and/or "off" signal wirelessly, via wireless controller 704, to microprocessor 113 and/or band controller 703. As such, a user can control both the desired target temperature of the electric grill 510, as well as turning it on and off.

Additional examples of wireless communication between remote device 901 and electric grill 510 (via wireless controller 704) include the ability to control settings for display 503 remotely, from remote device 901. Thus, remote device 901 may be adapted and configured to wirelessly control the information displayed on electric grill 510's display 503. Remote device 901 may control which information is displayed on display 503, and allow a user to toggle between (C) Celsius and (F) Fahrenheit with respect to temperature measurements. Such information may include the electric grill 510's current temperature, ambient temperature, target temperature, as well as timers indicating how long the grill has been active, how long a food has been cooking, or how much time remains until a food reaches its target temperature. Such information may further be wirelessly transmitted from electric grill 510, via wireless controller 704, to remote device 901.

In turn, remote device 901 may provide such information to a user on a remote device display 902, and may further use said information to wirelessly turn electric grill 510 off, or reduce its desired target temperature, if a predetermined temperature has been reached, or if a food has been cooking for a predetermined time period. In exemplary embodiments, food profiles are stored in memory 904, where such food profiles indicate either the appropriate target temperature and/or an appropriate cooking time for a given food. Remote device 901 may monitor information received wirelessly from electric grill 510 and determine if an appropriate temperature or cooking time has been reached. Remote device 901 may also be adapted and configured to turn off electric grill 510 once that happens, and/or to provide an audible or visual alert. Such an audible and/or visual alert may be provided on the remote device 901, at the electric grill 510, or both.

Moreover, it is contemplated that embodiments of the inventions may use wireless communications to deliver error codes from the electric grill 510 to a remote device 901, where said error codes may be indicative of an unsafe current condition as described further herein. Delivering error codes to a remote device 901 has the advantage of allowing a user to remotely understand when an unsafe current condition has occurred, and remote device 901 may further display safety tips for correcting the unsafe current condition as well as recording the conditions that lead to the unsafe condition.

Error codes may be determined by microprocessor 113 acting in conjunction with the protection circuitry 100. As described further herein, microprocessor 113 may be in communication, via control lines, with Ground Fault Detection Unit 117 and Hall Effect sensor 119. Thus, microprocessor 113 may be adapted and configured to receive a control signal from Ground Fault Detection Unit 117 indicating that a ground fault has been detected. Likewise, microprocessor 113 may be adapted and configured to use signals from Hall Effect sensor 119 to recognize errors in delivering current to heating elements 103 and 104. As described further herein, a reading of zero current from Hall Effect sensor 119 indicates that heating elements 103 and 104 are not receiving any current, whereas an unexpectedly high current reading indicates that too much current is flowing to heating elements 103 and 104 (e.g. an "over-current" scenario).

In embodiments of the inventions, microprocessor 113 is adapted and configured to recognize these errors and wirelessly communicate, via wireless controller 704, an error code corresponding to the error which occurred. For example, an error code of "01" may indicate that a ground fault has been detected; "02" may indicate that Hall Effect sensor 119 has determined that no current (or an unexpected current) is flowing to heating elements 103 and/or 104; and "03" may indicate that Hall Effect sensor 119 detected an unexpectedly high current flowing to heating elements 103 and/or 104. In embodiments where microprocessor 113 is a chip including a "self-check" feature, an error code of "04" may be sent if the self-check pin determines a failure of microprocessor 113. A person of ordinary skill in the art would recognize that any variety of codes may be used to indicate each error. In response to an error, an audible or visual alert may be signaled at electric grill 510, including for example on display 503. Likewise, remote device 901 may also provide an audible or visual alert upon receiving an error code.

Remote device 901 may be adapted and configured to wirelessly receive error codes and display, on display 902, a message identifying the type of error to the user. Such an error message may be accompanied by an audible or visual alert at remote device 901. Remote device 901 may further be adapted and configured to display a message, saved in memory 904, explaining steps that a user should take to correct the error. For example, as explained further herein, protection circuitry 100 may be configured to trip a relay 106 and/or 107 in response to a ground fault. Therefore, if microprocessor 113 sends an error code (e.g. "01") indicating a ground fault to remote device 901, remote device 901 may display a message alerting a user that a ground fault has occurred and prompting the user to reset relay 106 and/or 107.

In response to an error "02," remote device 901 may be adapted and configured to alert the user that no current is flowing to heating element 103 and/or 104. The absence of current flowing may be indicative of an open circuit, which may occur, for example, if a heating element 103, 104 is not properly installed. Thus, remote device 901 may display a message prompting a user to uninstall, and re-install, heating elements 103, 104. If the error persists, remote device 801 may prompt the user to contact the manufacturer.

Similarly, if error code "03" is received, an over-current has occurred. One possible cause of an over-current may be that a user has installed an incompatible, or faulty, heating element having an incorrect resistance value. (A heating element with an incorrectly low resistance will cause an inappropriately high current to flow through it). For example, a heating element designed to work at 120V would have a resistance value that is too low to function at 230V, causing an overcurrent. Thus, a user may be prompted to check the heating element, or replace it with a new one.

Remote device 901 and/or microprocessor 113 may create a log of errors and store the error log in a memory. Such an error log may include a recording of each error that occurred. Moreover, in embodiments where remote device 901 receives status information (such as the temperature of heating elements, ambient temperature, temperature targets, cooking time, etc.) from electric grill 510, such status information may also be recorded in the error log. Status information may be delivered continuously, or in response to an error. By way of example, it may be advantageous to record how long a grill had been cooking before an error occurred, the grill's temperature at the time of an error, and other related information. An error log may be helpful in diagnosing errors. It should be understood that the error log may be created and/or stored on the remote device 901, electric grill 510 (or microprocessor 113), or both. A person of skill in the art would understand that a wide variety of parameters may be recorded and stored as part of an error log.

In some embodiments, remote device 901 may have an internet connection 905. Internet connection 905 allows remote device 901 to optionally send a recorded error log to a third party, such as an electric grill's manufacturer. A manufacturer can therefore better understand the error that occurred and the conditions surrounding the error. This can lead to product fixes and improvements.

The present inventions also provide methods for reducing the risk of unsafe electric conditions during grilling. In a preferred embodiment, a user may use an electric grill 510 to deliver current to one or more electric heating elements 103 and/or 104 which may be connected to a voltage line 101 and a neutral line 102 through triacs 108 and 109, and latch relays 106 and 107. When heating element 103 or 104 is activated by the user, a current transformer 105 in the electric grill 510's protection circuitry 100 measures a difference, if any, in the current drawn by electric grill 510 and the current returned from electric grill 510. If a current difference is detected, methods of the present inventions generate an electric signal to activate a trip controller 118 connected to a latch relay 106 and/or 107.

Methods of the present inventions may additionally include using the electric grill 510's protection circuitry 100 to measure current being delivered to a heating element 103 or 104 with a Hall Effect sensor 119 and conveying the measured current to a microprocessor 113. By activating the electric grill 510 and its protection circuitry 100, the microprocessor 113 compares the measured current to a predetermined current threshold. The predetermined current threshold may be dynamically selected based on the current operating mode selected by a user. If the measured current exceeds the predetermined threshold while the electric grill 510 is in use, the present inventions may include the step of disabling the flow of current by tripping a latch relay 106 and/or 107, or disabling a triac 108 and/or 109.

In additional embodiments, signals indicative of normal operation from the microprocessor 113 to a watchdog monitor 120 are sent. In turn, watchdog monitor 120 may enable triacs 108 and/or 109 to permit the flow of electricity to heating elements 103 and/or 104 during normal operation, and disable the flow of electricity during a phase of abnormal operation.

The devices and methods described above may be used to provide a safer electric grill experience. Various embodiments allow a user to activate a knob 501 and/or 502 (or other input means, such as wireless) to grill food using heat from heating elements 103 and/or 104, which in turn are controlled by a microprocessor 113. Display 503 may convey, among other things, the current temperature to the user to allow the user to decide when to put food onto a grate or how long to leave food cooking. A user may be using an electric grill 510 that has been exposed to harsh conditions for a prolonged period of time and which has electric components that may leak current. Embodiments of the invention provide a current transformer 105 which functions together with ground fault detection unit 117 and trip controller 118 to detect current leakage and, in response, trips latch relays 106 and 107. Although grilling will be halted, the user will remain safe from the leaking current. A user may respond, for example, by removing and re-installing heating elements 103, 104, and pushing a reset button 511 or similar switch. Provided the current leakage has been resolved, normal operation can continue.

During normal cooking, a heating element 103, 104 or other component may become unintentionally loose, or may be damaged from heat or other environmental factors. A possible result is that electric grill 510 may draw an unsafe current, which is detected by microprocessor 113 via a signal from Hall Effect sensor 119. The microprocessor 113 may respond by activating a trip controller 119 and thereby opening latches 106 and 107. As described above, the result is a stoppage of current and the user may attempt to restart the electric grill 510 via reset button 511.

Similarly, an unsafe condition may lead heater 103 and/or 104 to draw an amount of current that differs from the amount expected based on the user settings of knobs 501 and/or 502. In response, embodiments of the invention provide a microprocessor 113 which may disable triacs 108/109 (via their drivers) to stop the flow of current. A user may be alerted via display 503, but latches 106 and 107 are not tripped in this case, so in this instance, the user may not have to reset the button 511.

Further, embodiments of the invention may include a watchdog monitor 120 which may be provided to monitor the correct operation of microprocessor 113 while electric grill 510 is in use by a user. Watchdog monitor 120 may disable triacs 108/109 if microprocessor 113 enters an abnormal operating state, including a possible reboot. A user does not have to reset the button 511 and may wait for microprocessor 113 to return to normal operation to resume grilling.

The hardware and specifically configured microprocessor may be provided to a user to ensure a safe grilling experience. A person of skill in the art would recognize that electric grills having various combinations of the embodiments described above are possible, and not every feature must necessarily be included in each embodiment. Moreover, although the present inventions have particular applicability to grills for outdoor use, it will be understood by those of skill in the art that the present inventions may be used on a variety of grills or other devices, whether for indoor or outdoor use.

The present inventions also include methods for using a remote device 901, such as a cell phone or tablet, to communicate with an electric grill 510. For example, a user may use a cell phone to wirelessly communicate with electric grill 510 and activate it. Moreover, a user uses a remote device user input 903, such as a touch screen, to select a target desired target temperature. In embodiments of the invention, a user may select a desired cooking profile, and remote device 901 retrieves, from memory 904, the associated temperature, which is communicated wirelessly to microprocessor 113 and/or band controller 703.

In response, microprocessor 113, and band controller 703, raise the power delivered to heating elements 103, 104, until a desired target temperature is achieved. Band controller 703 may be used to maintain a temperature within the range of predetermined bands. In this way, a user may use electric grill 510 to cook a food item as long as no error has occurred at electric grill 510 (by extension, at protection circuitry 100). During normal operations, the user may wirelessly receive status information from electric grill 510 on remote device 901, including various parameters concerning the temperature, time, and status of the grill.

If an unsafe current condition occurs, microprocessor 113 may detect it, in accordance with the present disclosure, and send an error code to the user at the user's remote device 901. An audible and/or visual alert may be provided at electric grill 510 and/or remote device 901 to alert the user that an unsafe current condition has occurred. Moreover, the user may be presented with a message explaining the type of error which has occurred and providing suggestions for how to fix the error. In embodiments of the invention, the user may opt to save an error log, which may contain the type of error that occurred as well as various information surrounding the grill's operating conditions at the time of the error. The error log may then be sent over the internet to a manufacturer for further diagnoses and repair information.

The above description is not intended to limit the meaning of the words used in or the scope of the following claims that define the invention. Rather the descriptions and illustrations have been provided to aid in understanding the various embodiments. It is contemplated that future modifications in structure, function or result will exist that are not substantial changes and that all such insubstantial changes in what is claims are intended to covered by the claims. Thus, while preferred embodiments of the present inventions have been illustrated and described, one of skill in the art will understand that numerous changes and modifications can be made without departing from the claimed invention. In addition, although the term "claimed invention" or "present invention" is sometimes used herein in the singular, it will be understood that there are a plurality of inventions as described and claimed.

Various features of the present inventions are set forth in the following claims.

What is claimed is:

1. A system for monitoring a status of an electric grill, the system comprising:
   a heating element connected to a voltage line through at least one triac, the at least one heating element connected to a neutral line;
   a user input device for selecting a high, medium, or low operating mode of the at least one heating element;
   a latch connected between the heating element and the voltage line, the latch connected to a trip controller through a control line;
   a cooking surface;
   a temperature sensing device for measuring temperature at a first position inside a cook box of the electric grill, the temperature sensing device positioned on a first side of a plane defined by the cooking surface, the heating element positioned on the first side of the plane defined by the cooking surface;
   a Hall Effect sensor configured to measure current delivered to the heating element;
   a ground fault detection unit configured to detect a ground fault error between the voltage line and the neutral line;
   a current transformer to measure a difference in current between the voltage line and the neutral line, the current transformer connected through the control line to the ground fault detection unit;
   a wireless controller; and
   a microprocessor in communication with a memory, the user input device, the Hall Effect sensor, the ground fault detection unit, the temperature sensing device, and the wireless controller, wherein the microprocessor is to:
      receive a measured electrical current from the Hall Effect sensor;
      access the memory to retrieve an expected electrical current associated with the selected high, medium, or low operating mode of the heating element, the expected electrical current being an electrical current reading expected during normal operating conditions in said operating mode;
      calculate an estimated ambient temperature at a second position within the cook box based on the measured temperature at the first position, the second position located on a second side of the plane defined by the cooking surface, the second side of the plane opposite the first side of the plane;
      detect an error condition by comparing the measured electrical current to the expected electrical current;
      disable the latch to prevent the flow of current to the heating element in response to a measured electrical current that is higher or lower than the expected electrical current;
      respond to a detected error condition by adding an entry to an error log in the memory, the error log including at least a first error code associated with the error condition; and
      wirelessly send the error log to a remote device via the wireless controller.

2. The system of claim 1, further including:
   a self-check pin in operable communication with the microprocessor to detect a microprocessor failure condition;
   wherein the microprocessor is to receive a signal indicative of a ground fault error from the ground fault detection unit; and
   wherein the microprocessor is to store, in the error log, a first error code in response to detecting a ground fault error condition; a second error code in response to detecting a microprocessor failure condition; and a third error code in response to detecting a current mismatch condition, and wherein the error log is to associate an error code with an active time of the electric grill, a target temperature, the estimated ambient temperature, and a measured temperature at the time of the error condition.

3. The system of claim 1, wherein the microprocessor is connected to at least one of a relay or a triac driver for controlling the current delivered to the heating element.

4. The system of claim 3, wherein at least one of the microprocessor or a band controller is to, in response to receipt of an "off" signal from the remote device, disable current from being delivered to the heating element.

5. The system of claim 1, wherein the temperature sensing device, is implemented using a thermocouple.

6. The system of claim 5, further including a display in electronic communication with the microprocessor, wherein the microprocessor is to cause display of the estimated ambient temperature on the display.

7. The system of claim 6, wherein the microprocessor is to toggle between displaying the temperature in Celsius or Fahrenheit in response to a wireless signal from the remote device.

8. The system of claim 5, wherein the microprocessor is to wirelessly transmit the estimated ambient temperature to the remote device.

9. The system of claim 5, wherein the microprocessor to record operating parameters of the electric grill and to wirelessly transmit the operating parameters to the remote device.

10. The system of claim 9, wherein the microprocessor is to transmit the operating parameters continuously.

11. The system of claim 9, wherein the microprocessor is to transmit the operating parameters in response to an error.

12. The system of claim 9, wherein the operating parameters include a temperature measurement.

13. The system of claim 9, wherein the operating parameters include a timer indicative of the amount of time the heating element has been active.

14. The system of claim 1, wherein the remote device is to display, on a display of the remote device, a message indicative of the type of error corresponding to the received error code.

15. The system of claim 14, wherein the remote device is a cell phone.

16. The system of claim 14, wherein the remote device is a tablet device.

17. The system of claim 1, wherein the microprocessor is a chip having a self-check pin, and the wireless controller is to wirelessly send an error code to the remote device in response to a self-check signal indicating a microprocessor error.

18. A method for wirelessly monitoring a status of an electric grill, the method comprising:
   selecting an operating mode for a heating element using a user input device, the heating element connected to a voltage line and a neutral line via a triac and a latch relay;
   displaying, on a display device, the selected operating mode;

causing delivery of current associated with the selected operating mode to the heating element via the triac and the latch relay;

utilizing a temperature sensing device to measure a temperature at a first position inside a cook box of the electric grill, the temperature sensing device positioned on a first side of a plane defined by a grill grate, the heating element positioned on the first side of the plane defined by the grill grate;

using a microprocessor to estimate an ambient temperature at a second position within the cook box based on the temperature measured by the temperature sensing device, wherein the second position is located on a second side of the plane defined by the grill grate, the second side of the plane opposite the first side of the plane;

using a current transformer to measure a current difference between the voltage line and the neutral line;

generating an electric signal indicating the current difference and responding to said current difference by activating a trip controller connected to the latch relay;

measuring, using a Hall Effect sensor, an electrical current delivered to the heating element;

detecting a ground fault error condition using a ground fault detection unit connected to the voltage line and the neutral line;

responding to the ground fault error condition by generating a signal indicative of the ground fault error condition;

determining, by executing an instruction with a microprocessor, an expected electrical current associated with the selected operating mode, the expected electrical current being electrical current reading expected during normal operating conditions in the selected operating mode;

detecting, by executing an instruction with the microprocessor, a current mismatch condition by comparing the measured electrical current to the expected electrical current;

disabling the latch relay to disable the heating element in response to a measured electrical current that is higher or lower than the expected electrical current; in response to detecting an error condition, storing an error log in a memory, wherein the error log includes at least a first error code associated with the error condition; and transmitting the error log, wirelessly, to a remote device.

19. The method of claim 18, further including:
using the microprocessor to determine an active time of the electric grill; and
transmitting, wirelessly, the temperature and the active time to the remote device.

20. The method of claim 19, further including using the remote device to display, at the remote device, a message indicative of the error received.

21. The method of claim 20, further including:
using a self-check pin to monitor a microprocessor failure condition;
storing, in the error log, a first error code in response to detecting a ground fault error condition, a second error code in response to detecting a microprocessor failure condition, or a third error code in response to detecting a current mismatch condition; and associating each stored error code with the active time of the electric grill, a target temperature, and a measured temperature at the time of the error condition.

22. The method of claim 21, further including using the remote device to communicate the log over the internet.

23. The method of claim 19, further including displaying, on a display at the electric grill, the estimated ambient temperature.

24. The method of claim 23, further including using the remote device to wirelessly toggle the display between Celsius and Fahrenheit.

25. An electric grill, comprising:
a housing having one or more user inputs for selecting a high, medium, or low operating mode of a heating element, and a display device to display the selected operating mode, the heating element being connected to a triac and further connected to a voltage line and a neutral line;
a latch relay connected between the heating element and the voltage line, the latch relay being in communication with a trip controller;
a ground fault detection unit in communication with the trip controller and configured to activate the trip controller in response to an unbalanced current between the voltage line and the neutral line;
a temperature sensing device for measuring temperature at a first position within the housing, the temperature sensing device positioned on a first side of a plane defined by a cooking surface, the heating element positioned on the first side of the plane defined by a cooking surface;
a microprocessor connected to a triac driver, the triac driver being in communication with the triac, wherein the microprocessor is to activate the triac driver to deliver a current associated with the selected operating mode; and
a Hall Effect sensor configured to measure current passing through the triac, the current sensor to communicate a measured current to the microprocessor;
wherein the microprocessor is to:
  access a memory to retrieve an expected current associated with the selected high, medium, or low operating mode of the heating element;
  calculate an estimated ambient temperature at a second position within the housing based on the measured temperature at the first position, the second position located on a second side of the plane defined by the cooking surface, the second side of the plane opposite the first side of the plane;
  compare the measured current with the expected current for the selected high, medium, or low operating mode;
  disable the latch relay to prevent the flow of current to the heating element in response to a measured current that is higher or lower than the expected current;
  alert a user, via the display, that the flow of current has been disabled; and
  cause transmission of an error message to a remote device via a wireless controller.

26. The electric grill of claim 25, further including the wireless controller.

* * * * *